United States Patent
Ogawa et al.

(10) Patent No.: US 10,529,969 B2
(45) Date of Patent: Jan. 7, 2020

(54) PRESSURE RELIEF MECHANISM, CASE, AND PRESSURE RELIEF VALVE

(71) Applicants: KABUSHIKI KAISHA TOSHIBA, Minato-ku (JP); Toshiba Infrastructure Systems & Solutions Corporation, Kawasaki-shi (JP)

(72) Inventors: Takaya Ogawa, Kawasaki (JP); Kaoru Koiwa, Tokyo (JP); Keitaro Hino, Tokyo (JP); Shinya Aikawa, Hamura (JP); Hiroaki Asai, Fujisawa (JP)

(73) Assignees: KABUSHIKI KAISHA TOSHIBA, Minato-ku (JP); Toshiba Infrastructure Systems & Solutions Corporation, Kawasaki-shi (JP)

(*) Notice: Subject to any disclaimer, the term of this patent is extended or adjusted under 35 U.S.C. 154(b) by 0 days.

(21) Appl. No.: 15/704,675

(22) Filed: Sep. 14, 2017

(65) Prior Publication Data

US 2018/0097214 A1    Apr. 5, 2018

(30) Foreign Application Priority Data

Oct. 4, 2016 (JP) .................................. 2016-196252
Feb. 13, 2017 (JP) .................................. 2017-024354

(51) Int. Cl.
*B65D 51/16* (2006.01)
*H01M 2/12* (2006.01)
(Continued)

(52) U.S. Cl.
CPC ............ *H01M 2/12* (2013.01); *B65D 77/225* (2013.01); *B65D 79/005* (2013.01);
(Continued)

(58) Field of Classification Search
CPC .... H01M 2/12; H01M 2/1016; H01M 2/1229; H01M 2/1264; H01M 2/1276;
(Continued)

(56) References Cited

U.S. PATENT DOCUMENTS 3,497,395 A * 2/1970 Kohen ................ F16K 17/0446
                                                    137/860
4,131,722 A * 12/1978 Sugalski ............ B65D 51/1644
                                                    137/516.15

(Continued)

FOREIGN PATENT DOCUMENTS

EP    2 704 542 A1    3/2014
EP    2 711 609 A1    3/2014
(Continued)

OTHER PUBLICATIONS

Extended European Search Report dated Apr. 16, 2018 in European Patent Application No. 17189176.5 citing documents AA-AB and AX therein, 20 pages.

(Continued)

*Primary Examiner* — J. Gregory Pickett
*Assistant Examiner* — Niki M Eloshway
(74) *Attorney, Agent, or Firm* — Oblon, McClelland, Maier & Neustadt, L.L.P.

(57) ABSTRACT

According to embodiments, a pressure relief mechanism comprises a case with an installation hole formed therein, and a pressure relief valve. The pressure relief valve comprises an insertion portion which comprising a vent path formed in an axial portion of the insertion portion and a slit formed in a peripheral wall portion of the insertion portion so as to communicate with the vent path, a pedestal portion provided at an outer end of the insertion portion, a locking portion provided at an inner end of the insertion portion and locked on an inner edge of the installation hole, and a (Continued)

ring-like seal member interposed between around the installation hole and the pedestal portion, the seal portion comprising an elastic member.

17 Claims, 15 Drawing Sheets

(51) Int. Cl.

| | | |
|---|---|---|
| B65D 79/00 | (2006.01) | |
| F16K 15/14 | (2006.01) | |
| H01M 2/10 | (2006.01) | |
| H05K 5/00 | (2006.01) | |
| H05K 5/02 | (2006.01) | |
| B65D 77/22 | (2006.01) | |
| F16K 17/04 | (2006.01) | |
| F16K 24/04 | (2006.01) | |
| F16K 24/06 | (2006.01) | |
| B65D 53/02 | (2006.01) | |

(52) U.S. Cl.
CPC ........ *F16K 15/147* (2013.01); *F16K 17/0446* (2013.01); *F16K 17/0493* (2013.01); *F16K 24/04* (2013.01); *F16K 24/06* (2013.01); *H01M 2/1016* (2013.01); *H01M 2/1229* (2013.01); *H01M 2/1264* (2013.01); *H01M 2/1276* (2013.01); *H05K 5/0008* (2013.01); *H05K 5/0213* (2013.01); *H05K 5/0221* (2013.01)

(58) Field of Classification Search
CPC .. B65D 77/225; B65D 79/005; H05K 5/0008; H05K 5/0213; H05K 5/0221; F16K 15/147; F16K 17/0446; F16K 17/0493; F16K 24/00; F16K 24/04
USPC ........ 220/4.33, 327, 203.12, 203.11, 203.28, 220/370, 372
See application file for complete search history.

(56) References Cited

U.S. PATENT DOCUMENTS

| | | | | |
|---|---|---|---|---|
| 4,599,484 A | * | 7/1986 | Bramwell | ............ H05K 5/0008 174/50 |
| 5,004,129 A | | 4/1991 | Loch et al. | |
| 5,532,431 A | * | 7/1996 | Saka | ........................ B29C 39/24 174/521 |
| 6,629,619 B2 | * | 10/2003 | Sato | ........................ H02G 3/088 220/3.8 |
| 7,166,024 B2 | * | 1/2007 | Mashiko | ................ F21V 31/03 454/370 |
| 7,762,415 B2 | * | 7/2010 | Matsui | ................ H05K 5/0069 174/58 |
| 8,814,993 B2 | * | 8/2014 | Yano | ..................... F21S 48/332 96/4 |
| 9,120,060 B2 | * | 9/2015 | Uemura | ................ B01D 69/10 |
| 9,121,626 B2 | * | 9/2015 | Uemura | ................ F24F 13/28 |
| 9,295,949 B2 | * | 3/2016 | Uemura | ................ B01D 69/02 |
| 9,332,662 B2 | * | 5/2016 | Yano | ..................... H05K 5/0213 |
| 2008/0041624 A1 | * | 2/2008 | Sasaki | ................ H05K 5/0213 174/520 |
| 2009/0047890 A1 | * | 2/2009 | Yano | ..................... B65D 77/225 454/143 |
| 2012/0114999 A1 | | 5/2012 | Park et al. | |
| 2013/0012117 A1 | * | 1/2013 | Uemura | ................ F21S 45/30 454/275 |
| 2013/0330579 A1 | | 12/2013 | Ejiri et al. | |
| 2014/0154541 A1 | | 6/2014 | Asakura et al. | |
| 2014/0335378 A1 | | 11/2014 | Kuroda | |
| 2015/0295215 A1 | | 10/2015 | Nagamine et al. | |

FOREIGN PATENT DOCUMENTS

| | | |
|---|---|---|
| EP | 2 733 418 A1 | 5/2014 |
| EP | 2 785 163 A2 | 10/2014 |
| JP | 61-062667 | 3/1986 |
| JP | 6-28991 | 4/1994 |
| JP | 11-111519 | 4/1999 |
| JP | 2000-274539 | 10/2000 |
| JP | 2001-143664 | 5/2001 |
| JP | 2002-367647 | 12/2002 |
| JP | 2003-297323 | 10/2003 |
| JP | 2008-103239 | 5/2008 |
| JP | 2011-86817 | 4/2011 |
| JP | 2012-231088 | 11/2012 |
| JP | 2013-526043 | 6/2013 |
| JP | 2013-168293 | 8/2013 |
| JP | 5594592 | 9/2014 |
| JP | 5703368 | 4/2015 |
| JP | 5708626 | 4/2015 |
| JP | 2015-125944 | 7/2015 |
| JP | 5741415 | 7/2015 |
| JP | 5761164 | 8/2015 |
| JP | 5780245 | 9/2015 |
| JP | 5786891 | 9/2015 |

OTHER PUBLICATIONS

BOPLA: "Gehause, Polyester, mit Silikondeckeldichtung", Euromas Polyester, p. 305 SIL, Best.—Nr. : 04305100, XP055465453, 2011, pp. 1-2.

* cited by examiner

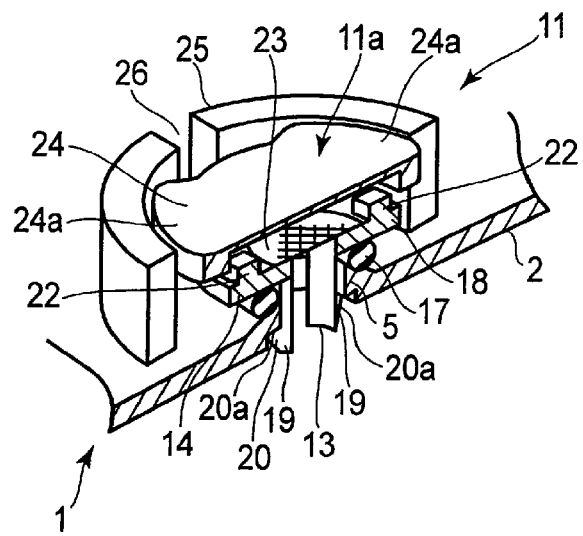
F I G. 2
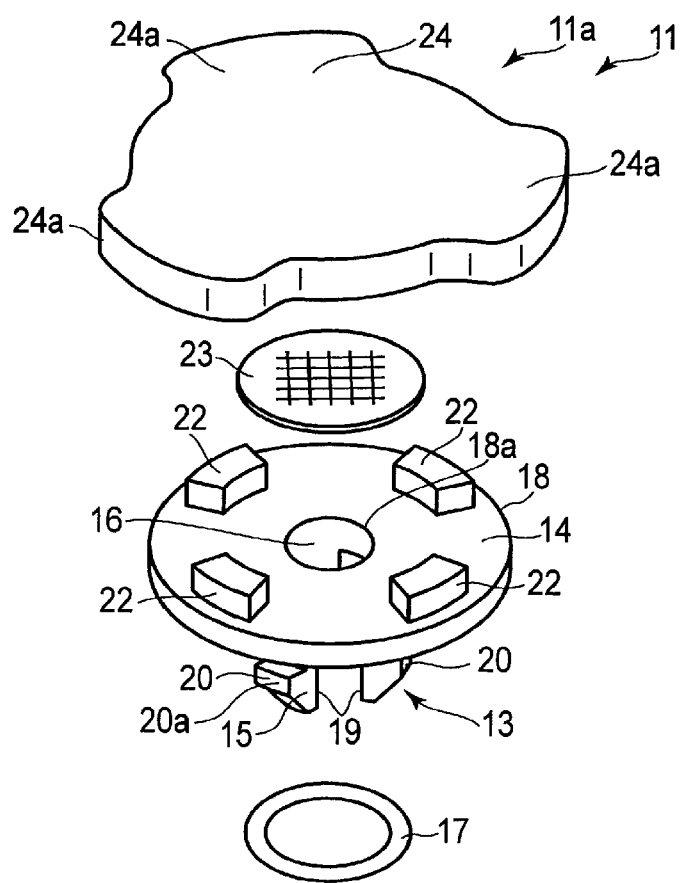
F I G. 3

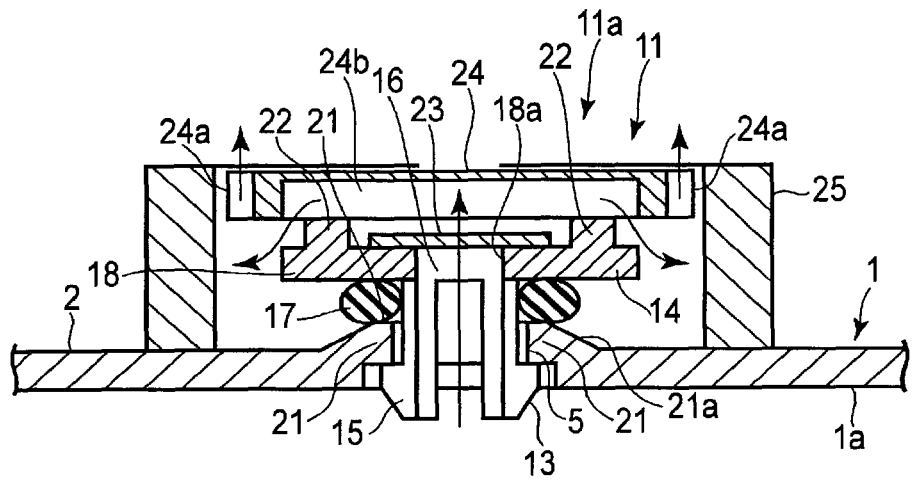
F I G. 6
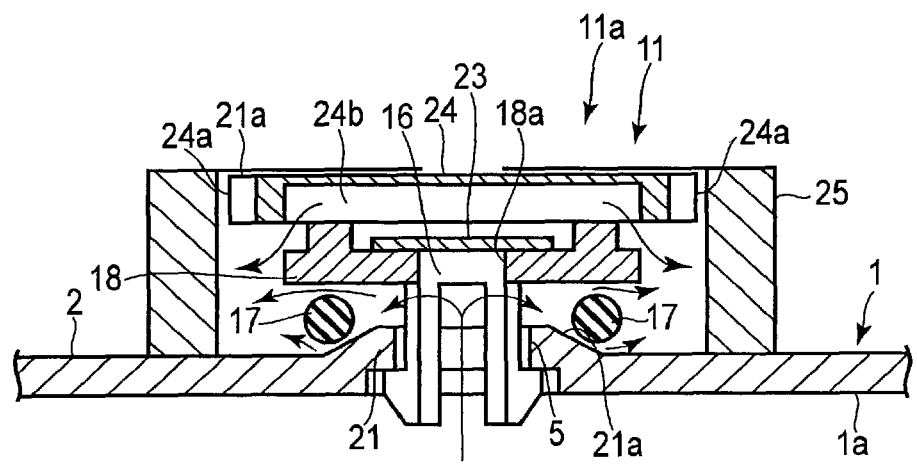
F I G. 7

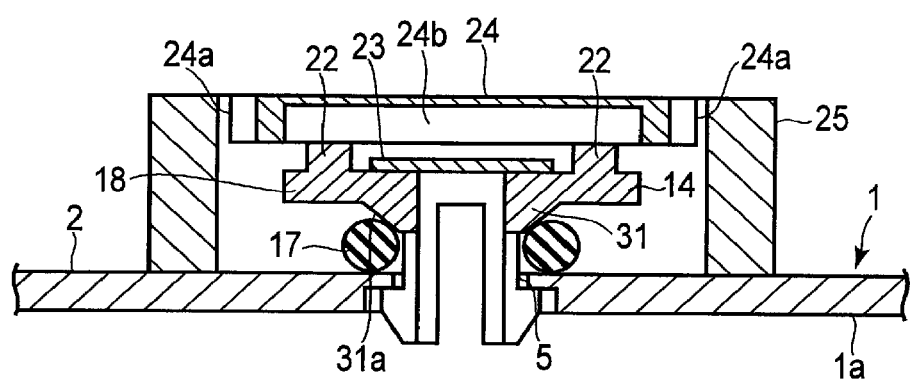
F I G. 8

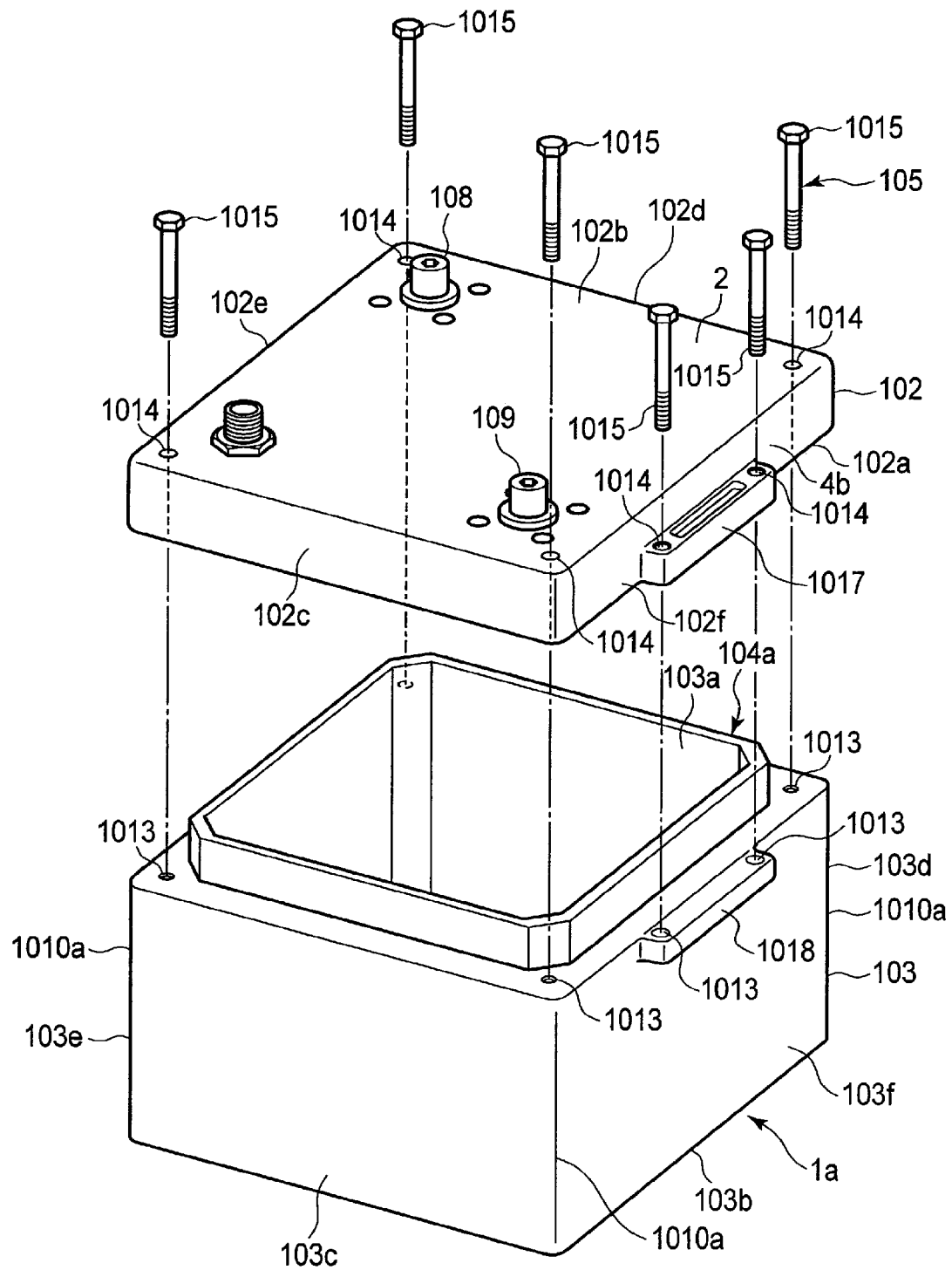
F I G. 9

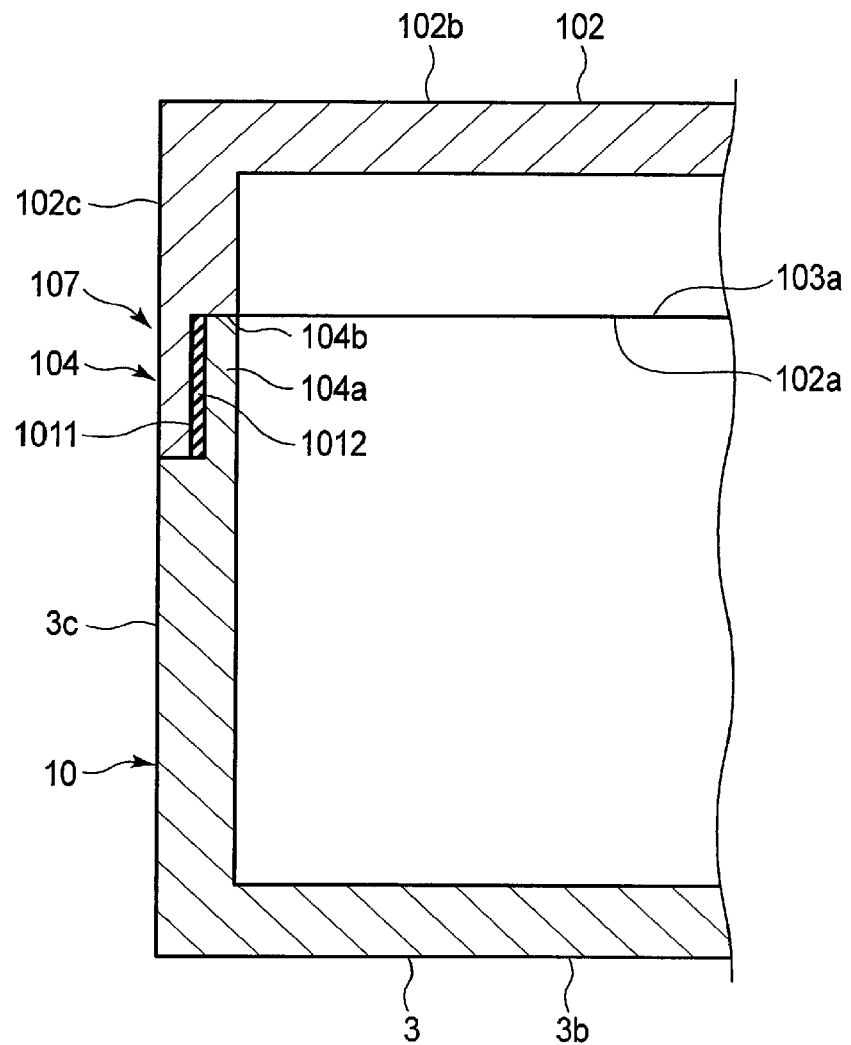
F I G. 10

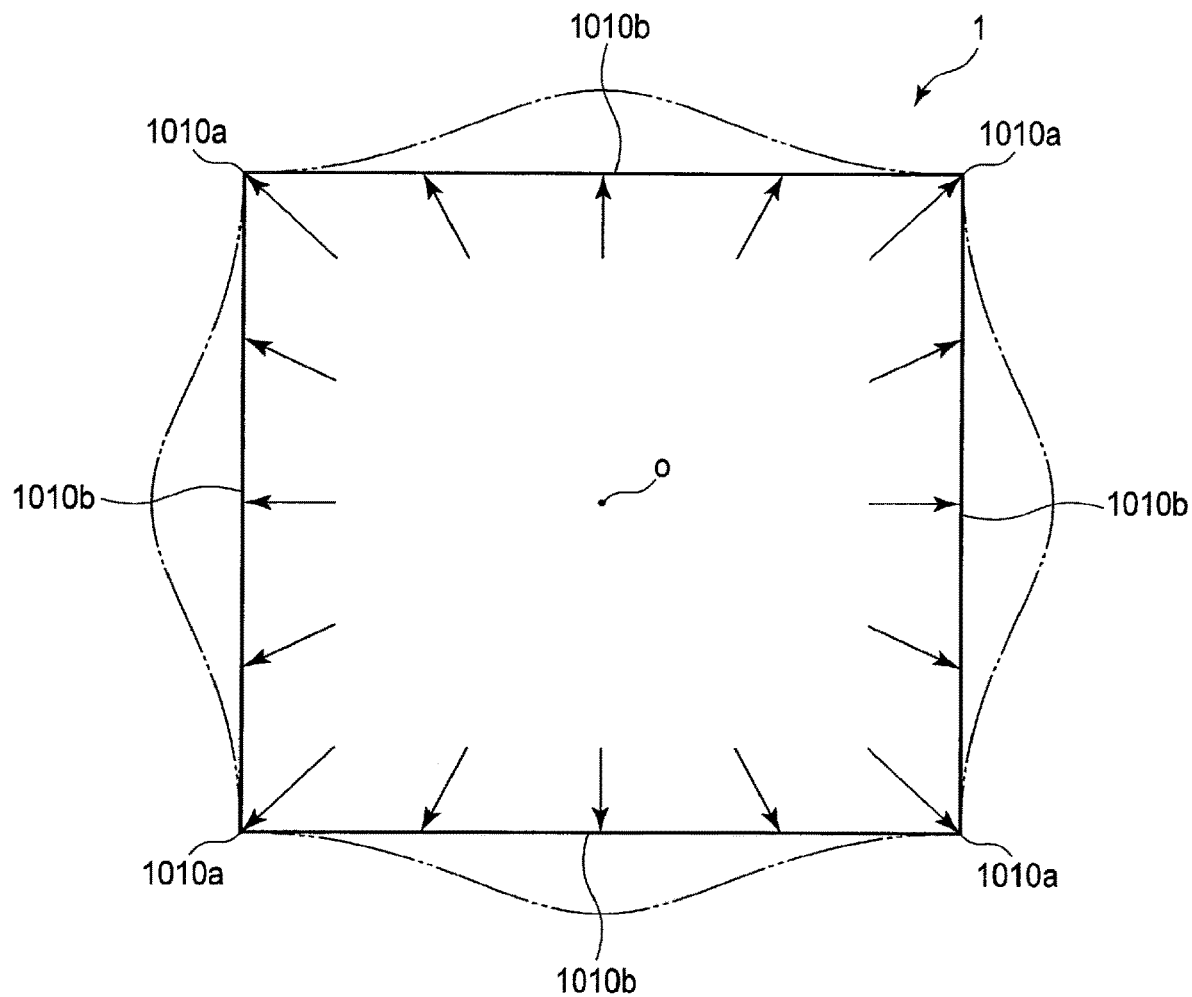
F I G. 11

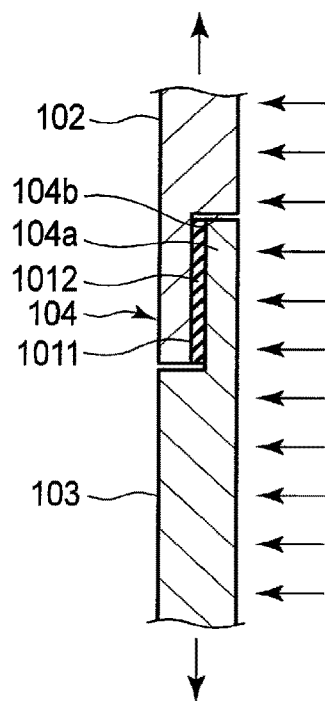
F I G. 12
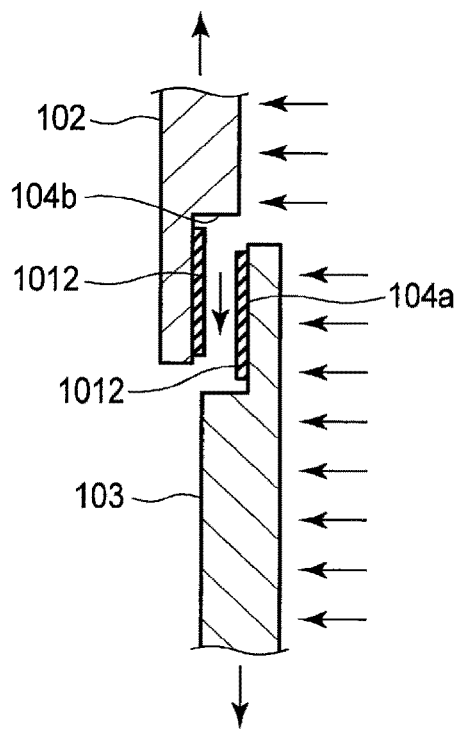
F I G. 13

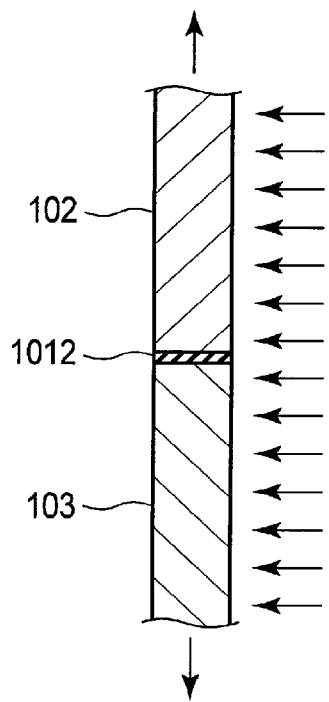
F I G. 14
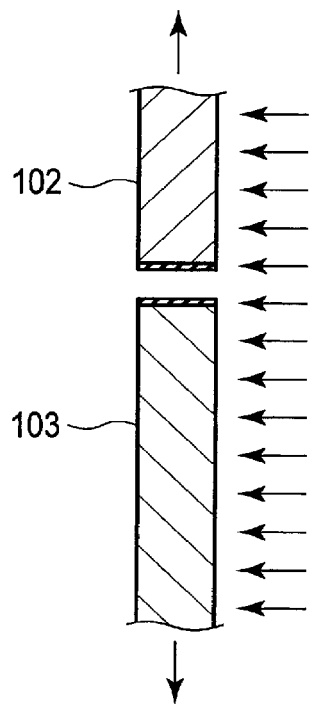
F I G. 15

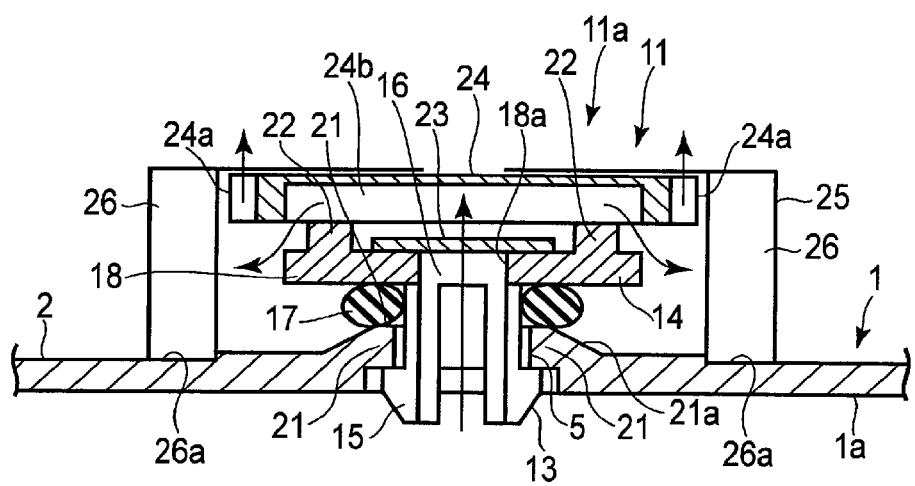
F I G. 23

PRESSURE RELIEF MECHANISM, CASE, AND PRESSURE RELIEF VALVE

CROSS-REFERENCE TO RELATED APPLICATIONS

This application is based upon and claims the benefit of priority from Japanese Patent Application No. 2016-196252, filed Oct. 4, 2016; and Japanese Patent Application No. 2017-024354, filed Feb. 13, 2017; the entire contents all of which are incorporated herein by reference.

FIELD

Embodiments described herein relate generally to a pressure relief mechanism, a case, and a pressure relief valve.

BACKGROUND

A large, thin, and light waterproof case such as a battery case is equipped with a safety apparatus configured to prevent the waterproof case from bursting as a result of an increase in internal pressure thereof. Examples of a general safety apparatus include a pressure relief valve and a rupture disc. However, these safety apparatuses are not actuated unless a certain level of pressure is applied to the apparatus because a portion of the apparatus which is subjected to pressure is small in size with respect to the case.

For airtight cases with low pressure resistance, the pressure relief valve has a significantly weak spring force, and the rupture disc has a significantly small film thickness. Thus, due to disturbances other than the pressure in use (for example, vibration, acceleration caused by impact or the like, and incoming fragments such as dust) or aging (corrosion or degradation of a material caused by ultraviolet rays) the pressure relief valve or the rupture disc may be actuated at a pressure equal to or lower than a pressure which needs to be withstood by the pressure relief valve or the rupture disc. Consequently, the airtightness may be lost.

On the other hand, for waterproof cases with low pressure resistance, a waterproof breathing filter (porous PTFE film) is often used to prevent leakage and damage to the case resulting from a difference in pressure between the inside and outside of the case. However, the waterproof breathing filter is subjected to a heavy pressure loss associated with gas transmission and thus has a limited gas transmission rate. Thus, the waterproof breathing filter fails to deal with a rapid change in the volume of an internal gas. When the limit is exceeded, the pressure in the case is higher than the withstanding pressure of the case, which may thus burst. As is the case with airtight cases with low pressure resistance, many filters are small in size, and many filters themselves have a bursting pressure higher that the withstanding pressure of the case.

The small waterproof breathing filter may be blocked from any cause, for example, clogging with dust, freezing, or contamination with oil. In this case, the small waterproof breathing filter may fail to breath, similarly making the pressure in the case higher than the withstanding pressure of the case.

BRIEF DESCRIPTION OF THE DRAWINGS

FIG. 2 is a sectional perspective view depicting an attachment state of a pressure relief valve attached to a top plate of the explosion-proof waterproof case in a first embodiment;

FIG. 3 is an exploded perspective view depicting a general configuration of the first pressure relief valve in the first embodiment;

FIG. 6 is a longitudinal sectional view depicting a state observed before actuation of the first pressure relief valve in the first embodiment;

FIG. 7 is a longitudinal sectional view depicting a state observed after actuation of the first pressure relief valve in the first embodiment;

FIG. 8 is a longitudinal sectional view depicting a modification of the first embodiment of the first pressure relief valve;

FIG. 9 is an exploded perspective view of the explosion-proof waterproof case in the first embodiment;

FIG. 10 is a longitudinal sectional view of a main part of the explosion-proof waterproof case in the first embodiment, depicting a case fitting portion between an upper case and a lower case of the explosion-proof waterproof case;

FIG. 11 is a diagram schematically illustrating pressure acting inside a case main body of the explosion-proof waterproof case in the first embodiment as viewed from above the case main body;

FIG. 12 is a longitudinal sectional view of a main part of the explosion-proof waterproof case in the first embodiment, illustrating force acting on the case fitting portion as a result of the internal pressure of the explosion-proof waterproof case in the first embodiment;

FIG. 13 is a longitudinal sectional view of a main part of the explosion-proof waterproof case in the first embodiment, illustrating a state of the case fitting portion during operation;

FIG. 14 is a longitudinal sectional view of a main part of the explosion-proof waterproof case in the first embodiment, illustrating force acting on the case fitting portion as a result of the internal pressure in a comparative example of the explosion-proof waterproof case in the first embodiment;

FIG. 15 is a longitudinal sectional view of a main part of the comparative example in FIG. 14, illustrating a state in which the case is ruptured;

FIG. 23 is a longitudinal sectional view depicting another example of the case main body.

DETAILED DESCRIPTION

According to embodiments, a pressure relief mechanism comprises a case with an installation hole formed therein, and a pressure relief valve. The pressure relief valve comprises an insertion portion inserted into the installation hole and comprising a vent path formed in an axial portion of the insertion portion and a slit formed in a peripheral wall portion of the insertion portion so as to communicate with the vent path, a pedestal portion provided at an outer end of the insertion portion arranged outside the case, a locking portion provided at an inner end of the insertion portion inserted into the case and locked on an inner edge of the installation hole, and a ring-like seal member interposed between a wall portion of the case around the installation hole and the pedestal portion so as to surround a periphery of the installation hole, the seal portion comprising an elastic member.

According to the embodiments, the case comprises a lower case which is shaped like a rectangular box and in which an upper surface opening is formed, an upper case in which a lower surface opening is formed, a case fitting portion comprising a fitting recessed portion formed in one of a peripheral wall portion of the upper surface opening in the lower case and a peripheral wall portion of the lower surface opening in the upper case and a fitting protruding portion formed in the other of the peripheral wall portions, the fitting protruding portion and the fitting recessed portion being joined together to close a gap between the lower case and the upper case, at least one of the fitting recessed portion and the fitting protruding portion being relieved at a predetermined pressure, and a screw fixing portion configured to threadably fix the upper case and the lower case together.

According to the embodiments, a pressure relief valve comprises an insertion portion enabled to be inserted into an installation hole in an internally closed case and comprising a vent path formed in an axial portion of the insertion portion and a slit formed in a peripheral wall portion of the insertion portion so as to communicate with the vent path, a pedestal portion formed at an end of the insertion portion, a locking portion formed at a second end of the insertion portion and enabled to be locked on an inner edge of the installation hole, and a ring-like seal member interposed between the case and the pedestal portion so as to surround a periphery of the installation hole, the seal portion comprising an elastic member.

Figure 1:
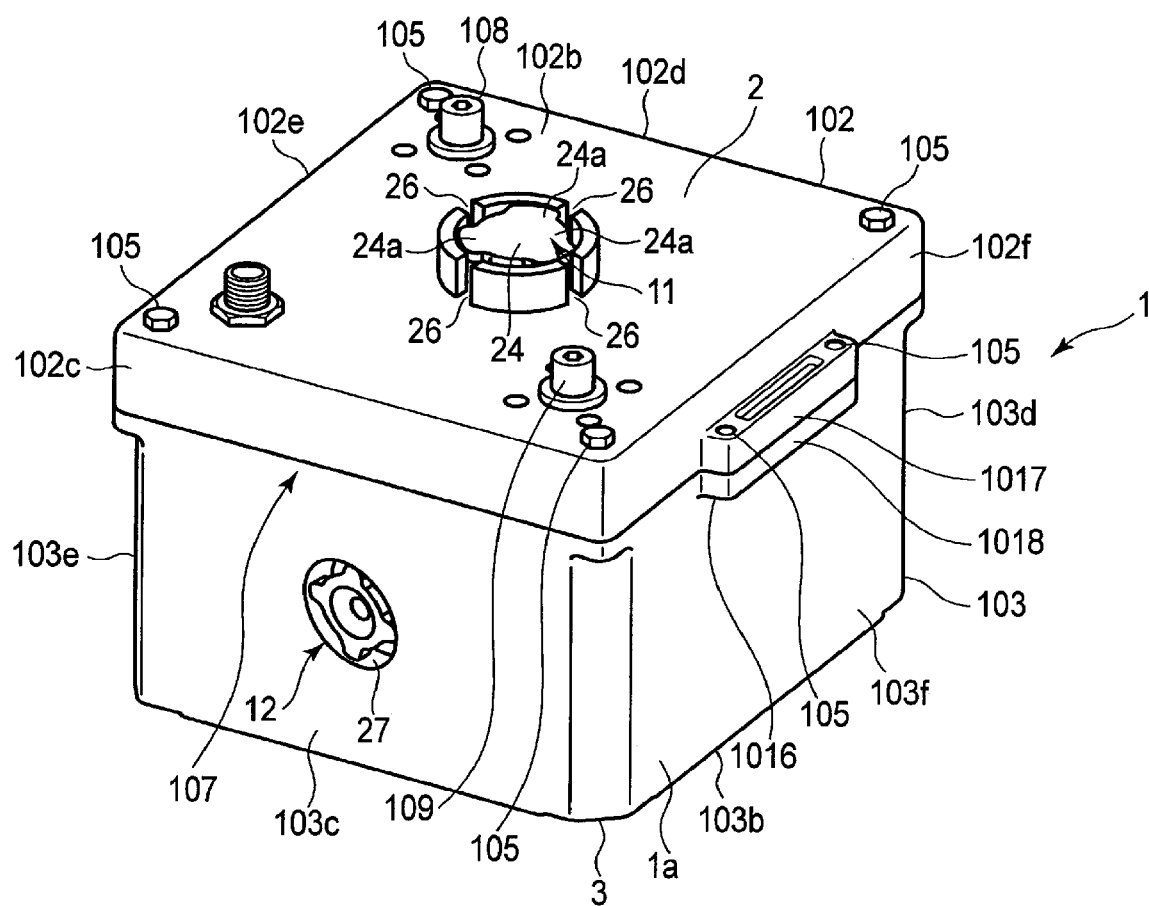
FIG. 1 is a perspective view depicting a general configuration of the whole of an explosion-proof waterproof case in a first embodiment.

FIGS. 1 to 22 illustrate a first embodiment. FIG. 1 is a perspective view depicting a general configuration of the whole of an explosion-proof waterproof case 1, for example, a battery case for a secondary battery. FIG. 2 is a sectional perspective view depicting an attachment state of a first pressure relief valve 11 in the present embodiment attached to a top plate 2 of the explosion-proof waterproof case 1.

Figure 4:
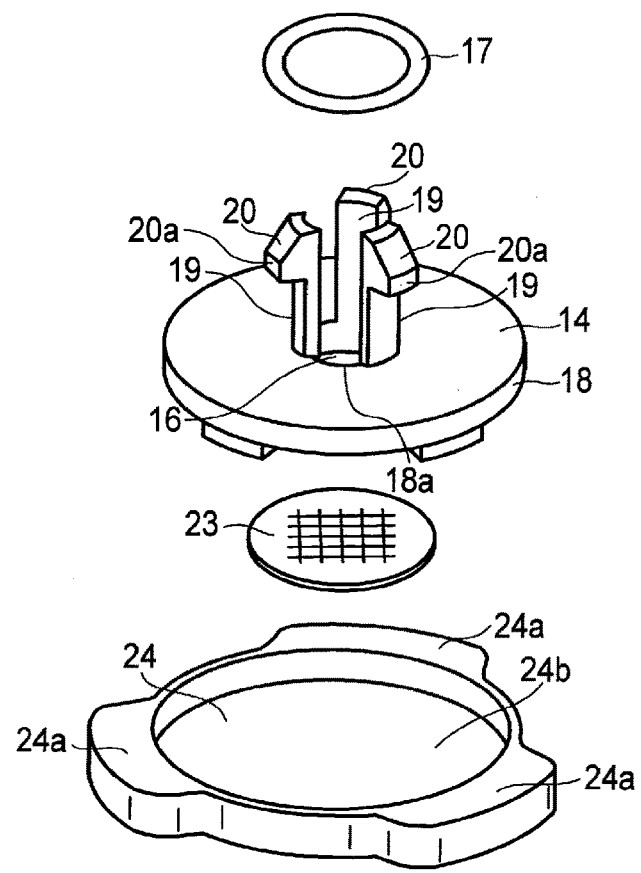
FIG. 4 is an exploded perspective view of the first pressure relief valve in FIG. 3 as seen from a rear side thereof.
Figure 5:
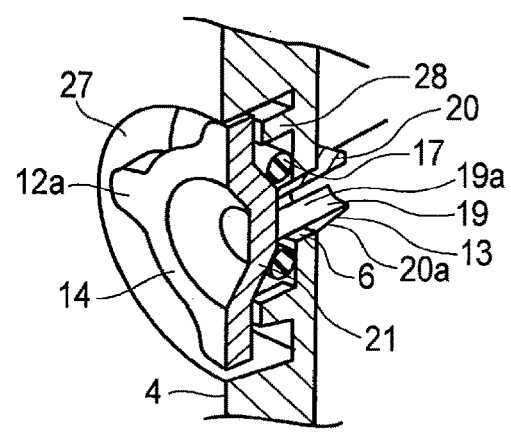
FIG. 5 is a sectional perspective view depicting an attachment state of a second pressure relief valve attached to a side plate of the explosion-proof waterproof case in the first embodiment.

FIG. 3 is an exploded perspective view depicting a general configuration of the first pressure relief valve 11 in FIG. 2. FIG. 4 is an exploded perspective view of the first pressure relief valve 11 in FIG. 3 as seen from a rear side thereof. FIG. 5 is a sectional perspective view depicting an attachment state of a second pressure relief valve 12 attached to a side wall portion 4 of the explosion-proof waterproof case 1.

The explosion-proof waterproof case 1 in the present embodiment forms a pressure relief mechanism. The explosion-proof waterproof case 1 comprises a case main body 1a, the first pressure relief valve 11, and the second pressure relief valve 12. The case main body 1a is a housing shaped like a rectangular box and comprising the top plate 2 shaped like a rectangular flat plate, bottom plate 3 shaped like a rectangular flat plate, and side wall portions 4 providing four surfaces including a front surface, a rear surface, a right surface, and a left surface. The case main body 1a will be described below in detail.

The explosion-proof waterproof case 1 in the present embodiment is applied to a large, thin, and light waterproof case such as a battery case. Inside the explosion-proof waterproof case 1, a battery pack is housed in which a plurality of battery cells is arranged in juxtaposition, and a substrate, a bus bar, and other structural materials are also housed which are arranged on an upper surface side of the battery pack; the battery pack, the substrate, the bus bar, and the other structural materials are not depicted in the drawings. The battery cells are housed in a cell can (or a laminate film) or the like.

In the case main body 1a, a circular installation hole 5 (see FIG. 2) in which the first pressure relief valve 11 is installed is formed in the top plate 2 of the explosion-proof waterproof case 1. The first pressure relief valve 11 is installed in the installation hole 5. Similarly, in one of the side wall portions 4 of the explosion-proof waterproof case 1, a circular installation hole 6 (see FIG. 5) is formed in which the second pressure relief valve 12 is installed. The second pressure relief valve 12 is installed in the installation hole 6.

As depicted in FIG. 3, the first pressure relief valve 11 comprises an insertion portion 13, a pedestal portion 14, a locking portion 15, a vent path 16, and a ring-like seal member 17.

The insertion portion 13 is inserted into the installation hole 5. The insertion portion 13 is formed, for example, like a tube having three leg portions 19 spaced from one another as described below. The pedestal portion 14 is provided at an outer end of the insertion portion 13 arranged outside the case main body 1a. The locking portion 15 is provided at an inner end of the insertion portion 13 inserted into the case main body 1a, and the first pressure relief valve 11 is locked on an inner edge of the installation hole 5.

The vent path 16 is formed in an axial portion of the insertion portion 13 and the pedestal portion 14. The ring-like seal member 17 is formed of an elastic member, for example, an O ring. The seal member 17 is interposed between a wall portion of the case main body 1a located around the installation hole 5 and the pedestal portion 14 so as to surround a periphery of the installation hole 5 and to occlude the vent path 16.

The pedestal portion 14 comprises a disc-like base member 18. A circular hole 18a forming the vent path 16 is formed in a central portion of the base member 18. As depicted in FIG. 4, a plurality of, in the present embodiment, three, elastically deformable leg portions 19 are formed on a lower surface of the base member 18. In the present embodiment, a pawl portion 20 which protrudes outward is formed at a tip portion (in FIG. 4, an upper end) of each of the three leg portions 19. The pawl portion 20 comprises a locking protruding portion 20a which protrudes outward. The three leg portions 19 form the insertion portion 13. Slit-like gaps 19a are each formed between the two leg portions 19. The gaps 19a are in communication with the vent path 16. The three pawl portions 20 form the locking portion 15.

As depicted in FIG. 6, a ring-like protruding portion 21 which protrudes outward is provided on an outer surface of the case main body 1a at an edge of the installation hole 5. A tapered surface 21a is formed on an outer peripheral surface of the protruding portion 21 such, that an outer diameter of the protruding portion 21 gradually decreases toward a tip portion of the protruding portion 21.

As depicted in FIG. 6, the seal member 17 is pressed by the pedestal portion 14 so as to be installed on the tapered surface 21a of the protruding portion 21 while being compressed against the tapered surface 21a. Consequently, the seal member 17 is pressed against the tapered surface 21a of the protruding portion 21 to keep the inside of the case main body 1a water tight.

That is, the seal member 17 is sandwiched between the tapered surface 21a of the protruding portion 21 and the pedestal portion 14 to seal a space between the tapered surface 21a and the pedestal portion 14. This allows watertight sealing not only of a space between the installation hole 5 and the insertion portion 13 but also of the gaps 19a each located between the two leg portions 19. When a hydraulic pressure is applied to the explosion-proof waterproof case 1, the seal member 17 bites into the tapered surface 21a of the protruding portion 21 to allow high water tightness to be achieved.

If rapid volume expansion occurs inside the case main body 1a, the internal pressure of the case main body 1a allows the seal member 17 to be deformed to relieve the pressure in the case main body 1a as depicted in FIG. 7. Consequently, the seal member 17 has a function to relieve the pressure in the case main body 1a when rapid volume expansion occurs in the case main body 1a in case of emergency.

When the internal pressure of the case main body 1a is applied to seal member 17, the seal member 17 is elastically deformed in a direction in which the seal member 17 expands outward. At this time, an opening (gap) is formed between the seal member 17 and the tapered surface 21a. Through the gaps 19a and this opening, an internal gas in the case main body 1a is efficiently emitted. Consequently, the internal pressure of the case main body 1a is relieved.

As depicted in FIG. 3, on an upper surface of the base member 18 of the pedestal portion 14, a plurality of, in the present embodiment, four, spacers 22 are formed near an outer peripheral portion of the base member 18 so as to protrude upward. The four spacers 22 have the same height. On the upper surface of the base member 18, a waterproof vent filter 23 (also referred to as a pressure relief portion or a waterproof breathing filter) is further arranged inside the four spacers 22.

The waterproof vent filter 23 is fixedly stuck to a periphery of the circular hole 18a so as to occlude the vent path 16 in the pedestal portion 14. The waterproof vent filter 23 is formed of, for example, a porous PTFE film. The waterproof vent filter 23 allows the gas inside the case main body 1a and the gas outside the case main body 1a to flow into and out from the case main body 1a, respectively, while keeping the inside of the case main body 1a waterproof.

Consequently, when the pressure of the air around the explosion-proof waterproof case 1 changes or the internal pressure of the case main body 1a changes as a result of a rise in temperature or the like, the gas inside the case main body 1a and the gas outside the case main body 1a are allowed to flow out from and into the case main body 1a, respectively (the gas inside the case main body 1a is exchanged with the gas outside the case main body 1a), with the case main body 1a kept waterproof. This inhibits a possible difference in pressure between the inside and outside of the case main body 1a. For the waterproof vent filter 23, a working pressure at which the internal pressure of the case main body 1a is relieved, that is, a pressure at which the gas is allowed to pass through the waterproof vent filter 23, is set to a value smaller than that of a pressure that acts on the seal member 17 through the gaps 19a to deform the seal member 17 to relieve the pressure in the case main body 1a.

Thus, in the present embodiment, the first pressure relief valve 11 comprises two pressure relief portions with different working pressures at which the internal pressure is to be relieved. That is, the first pressure relief valve 11 comprises the waterproof vent filter 23 that operates in a normal state (low pressure) and the seal member 17 that allows the pressure in the case main body 1a to be relieved when the internal volume of the case main body 1a rapidly expands in case of emergency (high pressure).

The first pressure relief valve 11 further comprises a cover member 24 arranged outside the pedestal portion 14 (in FIG. 2, above the pedestal portion 14). The cover member 24 is fixedly abutting contact with the plurality of spacers 22 on the pedestal portion 14. Specifically, the plurality of spacers is fixed to a recessed portion 24b, described below, of the cover member 24. That is, the cover member 24 is fixed to the pedestal portion 14 via the spacers 22. On the outer surface of the case main body 1a, a generally cylindrical barrier 25 is provided which surrounds an outer peripheral portion of the first pressure relief valve 11 to protect the first pressure relief valve 11.

On an outer peripheral surface of the cover member 24, a plurality of, in the present embodiment, three, projecting portions 24a for inhibition of runout are provided. A gap is present between an inner peripheral surface of the barrier 25 and the projecting portions 24a. When the first pressure relief valve 11 runs out by an amount exceeding a predetermined range, the projecting portions 24a come into abutting contact with the inner peripheral surface of the barrier 25. This prevents the first pressure relief valve 11 from further running out. That is, the projecting portions 24a come into abutting contact with the barrier 25 to inhibit the first pressure relief valve 11 from running out.

In an inner surface of the cover member 24, the recessed portion 24b is formed which corresponds to a vent path. Consequently, as depicted by arrows in FIG. 6, a gas flows along the vent path 16 in the pedestal portion 14 and through the waterproof vent filter 23 toward the cover member 24, and the gas then passes through the recessed portion 24b in the cover member 24 and through spaces between the barrier 25 and the projecting portions 24a of the cover member 24 and flows out from the explosion-proof waterproof case 1.

A cutout portion 26 for drainage is formed in a peripheral wall of the barrier 25. The cutout portion 26 is shaped like a slit extending in an axial direction of the barrier 25. The cutout portion 26 extends from the outer surface of the case main body 1a to a tip of the barrier 25. That is, a bottom surface 26a of the cutout portion 26 forms a part of the outer surface of the case main body 1a. A plurality of the cutouts 26 is formed.

On an outer surface of the top plate 2 of the case main body 1a, an area from an outer edge of the ring-like protruding portion 21 to the barrier 25, that is, an area inside the barrier 25 except for the protruding portion 21, is formed to be flush with the bottom surfaces 26a of the cutout portions 26. Consequently, water and dust inside the barrier 25 in the case main body 1a can be urged to be discharged out from the barrier 25 through the cutout portions 26. In this case, the water and dust inside the barrier 25 flow out from the barrier 25 through the cutout portions 26 for drainage, allowing drainage of the water inside the barrier 25. On the outer surface of the top plate 2 of the case main body 1a, an area outside the barrier 25 is at the same height as that of the bottom surfaces 26a of the cutout portions 26 or is lower than the bottom surfaces 26a. In the present embodiment, the outer surface of the top plate 2 is formed as a flat surface. Thus, on the outer surface of the top plate 2, the area outside the barrier 25 is flush with the bottom surfaces 26a of the cutout portions 26 and is located at the same height as that of the bottom surfaces 26a.

In an operation of installing the first pressure relief valve 11 in the present embodiment in the installation hole 5, first, the leg portions 19 are inserted into the seal member 17. Then, the leg portions 19 are elastically deformed in a direction in which the diameter of the set of the leg portions 19 is reduced. Subsequently, the leg portions 19 are elastically recovered such that the locking protruding portions 20a formed at the tips of the pawl portions 20 protrude out into the case main body 1a through the installation hole 5. The pawl portions 20 are thus locked on the inner edge of the installation hole 5. That is, the locking protruding portions 20 are locked on the inner edge of the installation hole 5. Consequently, by performing a simple operation of pushing the first pressure relief valve 11 into the installation hole 5, the first pressure relief valve 11 can be easily assembled into the case main body 1a.

The second pressure relief valve 12 is configured partly similarly to the first pressure relief valve 11. Thus, components of the second pressure relief valve 12 which have functions similar to those of the first pressure relief valve 11 are denoted by the same reference numerals and will not be described below. The second pressure relief valve 12 does not have the cover member 24. Moreover, the second pressure relief valve 12 is different from the first pressure relief valve 11 in the pedestal portion 14. Specifically, the vent path 16 is not formed in the pedestal portion 14 of the second pressure relief valve 12, and the protruding portion 21 is provided on the pedestal portion 14. The second pressure relief valve 12 does not comprise the waterproof vent filter 23. The second pressure relief valve 12 is otherwise similar to the first pressure relief valve 11.

As depicted in FIG. 5, the ring-like protruding portion 21 formed on the pedestal portion 14 of the second pressure relief valve 12 is formed to protrude toward the case main body 1a when the second pressure relief valve 12 is installed in the installation hole 6 in the case main body 1a. The tapered surface 21a is formed on the outer peripheral surface of the protruding portion 21 such that the outer diameter of the protruding portion 21 gradually decreases toward the tip portion of the protruding portion 21. The insertion portion 13 of the second pressure relief valve 12 is provided at the tip of the protruding portion 21.

In an outer surface of one of the side wall portions 4 of the explosion-proof waterproof case 1, a circular recessed depression 27 is formed in which the second pressure relief valve 12 is installed. The installation hole 6 is formed in an inner bottom portion of the recessed depression 27. A ring-like protruding portion 28 which protrudes outward is formed around an outer end of the installation hole 6 in the inner bottom portion of the recessed depression 27. The seal member 17 of the second pressure relief valve 12 is sandwiched between the tapered surface 21a of the protruding portion 21 and the inner bottom portion of the recessed depression 27 and is installed so as to be compressed against the tapered surface 21a of the protruding portion 21. Consequently, the seal member 17 is interposed between the wall portion of the case main body 1a located around the installation hole 6 and the pedestal portion 14 so as to surround a periphery of the installation hole 6 and to close the gaps 19a between the leg portions 19 and a space between the installation hole 6 and the insertion portion 13.

A ring-like protruding portion 28 is formed in the inner bottom portion of the recessed depression 27 around the installation hole 6. The seal member 17 and the protruding portion 21 are arranged inside the protruding portion 28. The protruding portion 28 has a height at which a gap is formed between the protruding portion 28 and the pedestal portion 14 of the second pressure relief valve 12 when the second pressure relief valve 12 is installed in the installation hole 6. When the second pressure relief valve 12 moves toward the inside of the case main body 1a as a result of a difference in pressure between the inside and outside of the case main body 1a, the movement is regulated by abutting contact of the pedestal portion 14 with the protruding portion 28.

A plurality of protruding portions 12a is formed on an outer peripheral surface of the pedestal portion 14 of the second pressure relief valve 12. A gap is formed between each of the protruding portions 12a and an inner peripheral surface of the recessed depression 27 when the second pressure relief valve 12 is installed in the installation hole 6. The protruding portions 12a of the second pressure relief valve 12 have a function to inhibit the second pressure relief valve 12 from running out. When the second pressure relief valve 12 runs out, the protruding portions 12a come into abutting contact with the inner peripheral surface of the recessed depression 27. The second pressure relief valve 12 is thus prevented from further running out.

The ring-like protruding portion 28 may have a function to inhibit the second pressure relief valve 12 from running out. That is, upon running out, the second pressure relief valve 12 may be prevented from further running out by come into abutting contact with the ring-like protruding portion 28.

Now, effects of the first pressure relief valve 11 of the explosion-proof waterproof case 1 in the present embodiment configured as described above will be described. In the explosion-proof waterproof case 1 in the present embodiment, when the pressure in the case main body 1a has not reached a value at which the seal member 17 of the first pressure relief valve 11 is deformed, the vent path 16 in the first pressure relief valve 11 is occluded by the seal member 17. In the normal state, the gas inside the case main body 1a is exchanged with the gas outside the case main body 1a through the waterproof vent filter 23 on a low pressure side, with the seal member 17 keeping the inside of the case main body 1a water tight.

In this case, the gas inside the case main body 1a flows along the vent path 16 in the pedestal portion 14 and through the waterproof vent filter 23 toward the cover member 24, as depicted by arrows in FIG. 6. Subsequently, the gas then passes through the recessed portion 24b in the cover member 24, through spaces between the spacers 22, through the spaces between the barrier 25 and the projecting portions 24a of the cover member 24, and through the cutout portions 26 of the peripheral wall of the barrier 25, and flows out from the explosion-proof waterproof case 1.

Thus, when the pressure of the air around the explosion-proof waterproof case 1 changes or the internal pressure of the case main body 1a changes as a result of a rise in temperature or the like, the waterproof vent filter 23 allows the gas inside the case main body 1a and the gas outside the case main body 1a to flow out from and into the case main body 1a, respectively (allows the gas inside the case main body 1a to be exchanged with the gas outside the case main body 1a). The case main body 1a is kept from being subjected to a difference in pressure between the inside and outside of the case main body 1a. This prevents the explosion-proof waterproof case 1 from bursting as a result of an increase in internal pressure thereof in the normal state.

When the gas inside the explosion-proof waterproof case 1 is subjected to a rapid change in volume (rapid internal volume expansion of the case main body 1a exceeding a gas transmission allowance (speed) of the waterproof vent filter 23), the internal pressure of the case main body 1a causes the seal member 17, which is an O ring, to be elastically deformed in the direction in which the seal member 17 expands outward as depicted in FIG. 7.

In this case, a large opening (gap) is formed between the seal member 17 and the tapered surface 21a of the protruding portion 21. Thus, as depicted by arrows in FIG. 7, the gas inside the case main body 1a passes along the vent path 16 in the pedestal portion 14 and through the gaps 19a, through the gap between the seal member 17 and the tapered surface 21a, through the gaps between the barrier 25 and the projecting portions 24a of the cover member 24, through the recesses between the projecting portions 24a, and through the cutout portions 26 of the peripheral wall of the barrier 25 and rapidly flows out from the explosion-proof waterproof case 1. Consequently, the gas inside the case main body 1a can be efficiently emitted to relieve the internal pressure of the case main body 1a.

When the gas inside the explosion-proof waterproof case 1 is subjected to a rapid change in volume (rapid internal volume expansion of the case main body 1a exceeding the gas transmission allowance (speed) of the waterproof vent filter 23), the second pressure relief valve 12 also allows the internal pressure of the case main body 1a to be relieved by an effect similar to the effect of the seal member 17 of the first pressure relief valve.

Thus, in the first pressure relief valve 11 in the present embodiment configured as described above, if rapid internal volume expansion exceeding the gas transmission allowance (speed) of the waterproof vent filter 23 occurs, the seal member 17 is elastically deformed to safely relieve the internal pressure of the case main body 1a, preventing the case main body 1a from being exploded. The first pressure relief valve 11 also operates if a failure in the waterproof vent filter 23 such as clogging thereof occurs. Thus, even if a failure in the waterproof vent filter 23 such as clogging thereof occurs, the case main body 1a is prevented from bursting.

Therefore, a pressure relief mechanism can be provided which allows the case main body 1a to be prevented from bursting when rapid expansion of the internal volume of a waterproof case with low pressure results from entry of the waterproof case with low pressure resistance into a state of emergency.

In the present embodiment, the ring-like protruding portion 21 which protrudes outward is provided at the outer end of the installation hole 5. The tapered surface 21a is formed on the outer peripheral surface of the protruding portion 21 such that the outer diameter of the protruding portion 21 gradually decreases toward the tip portion of the protruding portion 21. Thus, when a hydraulic pressure is applied to the explosion-proof waterproof case 1, the seal member 17 bites into the tapered surface 21a of the protruding portion 21 to allow high water tightness to be achieved.

When the internal pressure of the case main body 1a is applied to the seal member 17, which is an O ring, the seal member 17 is elastically deformed in the direction in which the seal member 17 expands outward. In this case, a large opening (gap) is formed between the seal member 17 and the tapered surface 21a of the protruding portion 21. The opening allows the gas inside the case main body 1a to be efficiently emitted, enabling the pressure to be relieved.

Moreover, in the first pressure relief valve 11 in the present embodiment, when the first pressure relief valve 11 is assembled, the seal member 17 is guided to the tapered surface 21a of the protruding portion 21 such that the center of the seal member 17 coincides with or substantially coincides with the center of the installation hole 5. The first pressure relief valve 11 is guided by the seal member 17 such that the center of the insertion portion 13 coincides with the center of the installation hole 5. Thus, the first pressure relief valve 11 and the seal member 17 can be smoothly assembled to the case main body 1a such that the seal member 17 comes into even abutting contact with the tapered surface 21a and with the pedestal portion 14 of the first pressure relief valve 11.

On the outer surface of the case main body 1a, the cylindrical barrier 25 is provided which surrounds the outer peripheral portion of the first pressure relief valve 11 to protect the first pressure relief valve 11. Moreover, the three projecting portions 24a for inhibition of runout are provided on the outer peripheral surface of the cover member 24. The projecting portions 24a come into contact with the inner peripheral surface of the barrier 25 to allow the first pressure relief valve 11 to be inhibited from running out.

The cutout portions 26 for drainage are formed in the peripheral wall of the barrier 25. On the outer surface of the case main body 1a, the area between the protruding portion 21 and the barrier 25 is flush with the bottom surface 26a of the barrier 25. Consequently, the water and dust collected inside the barrier 25 on the case main body 1a can be urged to be discharged out from the barrier 25. In this case, the water and dust collected inside the barrier 25 flow out from the barrier 25 through the cutout portions 26 for drainage, allowing easy drainage of the water collected inside the barrier 25.

Moreover, the first pressure relief valve 11 in the present embodiment comprises the two pressure relief portions with different working pressures at which the internal pressure is to be relieved. That is, the first pressure relief valve 11 comprises the waterproof vent filter 23 that operates in the normal state (low pressure) and the seal member 17 that allows the pressure in the case main body 1a to be relieved when the internal volume of the case main body 1a rapidly expands in case of emergency (high pressure). Thus, compared to a case where the waterproof vent filter and the seal member are separately provided, the apparatus as a whole can be miniaturized.

FIG. 8 is a longitudinal sectional view depicting a modification of the first pressure relief valve 11 in the first embodiment. Components in FIG. 8 which are the same as the corresponding components in FIGS. 1 to 7 are denoted by the same reference numerals and will not be described below. In the present modification, on a lower surface of the base member 18 of the pedestal portion 14 of the first pressure relief valve 11, a ring-like protruding portion 31 is provided which protrudes downward so as to surround the vent path 16. A tapered surface 31*a* is formed on an outer peripheral surface of the protruding portion 31 such that the outer diameter of the protruding portion 31 gradually decreases toward a tip portion of the protruding portion 31. The seal member 17 is interposed between the wall portion of the case main body 1*a* located around the installation hole 5 and the pedestal portion 14 so as to surround a periphery of the installation hole 5 and to close the vent path 16. The seal member 17 is installed so as to be compressed against the tapered surface 31*a* of the protruding portion 21. Consequently, the seal member 17 is pressed against the tapered surface 31*a* of the protruding portion 31 to keep the inside of the case main body 1*a* water tight.

Now, the case main body 1*a* will be described. FIG. 9 is an exploded perspective view of the case main body 1*a*. In FIG. 9, illustrations of the first pressure relief valve 11 and the second pressure relief valve 12 are omitted. FIG. 10 is a longitudinal sectional view of a main part of a case fitting portion 104 for an upper case 102 and a lower case 103 of the case main body 1*a*. FIG. 11 is a diagram schematically illustrating pressure acting inside the case main body 1*a* as viewed from above the case main body.

As depicted in FIG. 9, the case main body 1*a* comprises the upper case 102, the lower case 103, the case fitting portion 104, screw fixing portions 105, and a pressure relief portion 107. The lower case 103 is a housing which is shaped like a rectangular box and in which an upper surface opening 103*a* is formed. The lower case 103 comprises a bottom plate 3 shaped like a rectangular flat plate, and side wall portions 103*c*, 103*d*, 103*e*, 103*f* providing four surfaces including a front surface, a rear surface, a right surface, and a left surface. Inside the lower case 103, a battery pack is housed in which a plurality of battery cells is arranged in juxtaposition, and a substrate, a bus bar, and other structural materials are also housed which are arranged on an upper surface side of the battery pack; the battery pack, the substrate, the bus bar, and the other structural materials are not depicted in the drawings. The battery cells are housed in a cell can (or a laminate film) or the like.

The upper case 102 is a housing which is shaped like a rectangular box and in which a lower surface opening 102*a* is formed. The upper case 102 comprises the top plate 2 and side wall portions 102*c*, 102*d*, 102*e*, 102*f* providing four surfaces including a front surface, a rear surface, a right surface, and a left surface. On an upper surface of the upper case 102, a positive electrode terminal 108 and a negative electrode terminal 109 are provided. The positive electrode terminal 108 is connected to a positive electrode tab of a battery pack not depicted in the drawings. The negative electrode terminal 109 is connected to a negative electrode tab of the battery pack not depicted in the drawings.

The side wall portion 103*c* and the side wall portion 102*c* form one side wall portion 4. The side wall portion 103*d* and the side wall portion 102*d* form one side wall portion 4. The side wall portion 103*e* and the side wall portion 102*e* form one side wall portion 4. The side wall portion 103*f* and the side wall portion 102*f* form one side wall portion 4.

The pressure relief portion 107 is provided in the case main body 1*a* in which the upper case 102 and the lower case 103 are joined together. The pressure relief valve 107 is a safety apparatus configured to prevent the case main body 1*a* from bursting, and has a working pressure different from a working pressure for the seal member 17 of the first pressure relief valve 11 and a working pressure for the seal member 17 of the second pressure relief valve 12. In the present embodiment, the working pressure for the pressure relief portion 107 is higher than the working pressure for the seal member 17 of the first pressure relief valve 11 and the working pressure for the seal member 17 of the second pressure relief valve 12. The pressure relief valve 107 will be described below.

In the present embodiment, the case fitting portion 104 is formed at an abutting contact portion between an upper end of the lower case 103 (an end of the lower case 103 which is closer to the upper surface opening 103*a*) and a lower end of the upper case 102 (an end of the upper case 102 which is closer to the lower surface opening 102*a*). In this case, a fitting protruding portion 104*a* is formed on a peripheral wall portion of the upper surface opening 103*a* of the lower case 103.

The fitting protruding portion 104*a* is formed on the peripheral wall portion of the upper end of the lower case 103, which is closer to the upper surface opening 103*a*. The fitting protruding portion 104*a* is provided by forming, in the peripheral wall portion of the upper end, a cutout portion (step portion) which is depressed inward with respect to the remaining part of the peripheral wall portion. Specifically, the fitting protruding portion 104*a* is an upward protruding portion shaped like a rectangular frame and having a smaller external shape than the remaining part of the peripheral wall portion.

In the peripheral wall portion of the lower surface opening 102*a* of the upper case 102, a fitting recessed portion 104*b* is formed which can be fitted over the fitting protruding portion 104*a* of the lower case 103. The fitting recessed portion 104*b* is a recessed portion shaped like a rectangular frame and formed in an inner peripheral surface of the peripheral wall portion of the lower end of the upper case 102. The case fitting portion 104 is a portion in which the fitting protruding portion 104*a* of the lower case 103 is fitted into the fitting recessed portion 104*b* of the upper case 102. In the case fitting portion 104, the fitting recessed portion 104*b* may be formed in the lower case 103, and the fitting protruding portion 104*a* may be formed on the upper case 102.

As depicted in FIG. 10, between a wall portion of the fitting protruding portion 104*a* of the lower case 103 and a wall portion of the fitting recessed portion 104*b* of the upper case 102, a packing installation portion 1011 is formed which is a trap portion in which a packing can be installed. In the packing installation portion 1011, a packing 1012 which maintains airtightness, for example, a liquid packing, is installed.

The liquid packing is rubbery and fluid when applied. After being applied in the packing installation portion 1011, the liquid packing is hardened and becomes rubbery to adhere to a wall surface of the packing installation portion 1011, thus maintaining airtightness.

Consequently, with the fitting protruding portion 104*a* and the fitting recessed portion 104*b* fitted together, the space between the upper case 102 and the lower case 103 is closed with the packing 1012. The packing 1012, due to the rubbery nature thereof, follows deformation of the wall surface of the packing installation portion 1011 to some degree, thus maintaining airtightness.

As depicted in FIG. 1, the case main body 1*a* is provided with grip portions 1016, for example, at two positions on a junction portion between the upper case 102 and the lower case 103. On the upper case 102, projecting portions 1017 for the grip portion which extend outward are formed, for example, on two side wall portions 102*e*, 102*f* (FIG. 1 depicts only the projecting portion 1017 on the side wall portion 102*f*).

Similarly, on the lower case 103, projecting portions 1018 which extend outward are formed, for example, on two side wall portions 103e, 103f (FIG. 1 depicts only the projecting portion 1018 on the side wall portion 103f). When the upper case 102 and the lower case 103 are joined together, the projecting portions 1017 of the upper case 102 simultaneously join to the projecting portions 1018 of the lower case 103.

As depicted in FIG. 1, the screw fixing portions 105 are provided at (four) corners of the case main body 1a and at the grip portions 1016. Each of the screw fixing portions 105 comprises a screw 1015, a threaded hole 1013 into which the screw 1015 can be screw-threaded, and a screw insertion hole 1014 through which the screw 1015 can be inserted.

As depicted in FIG. 9, on the peripheral wall portion of the upper end of the lower case 103, the threaded holes 103 are formed in a stepped flat surface of a root portion of the fitting protruding portion 104a. In the upper case 102, the screw insertion holes 1014 are formed in areas corresponding to the threaded holes 1013 in the lower case 103. The fixing screws 1015 are each inserted, from above the upper case 102, through the corresponding screw insertion hole 1014 in the upper case 102 and fixedly screw-threaded into the corresponding threaded hole 1013 in the lower case 103. Consequently, the upper case 102 and the lower case 103 are threadably fixed together.

The grip portions 1016 are fixed using the screw fixing portions 105. For example, the screw insertion holes 1014 are formed in each of the projecting portions 1017 of the upper case so that the fixing screws 1015 are inserted through the respective screw insertion holes 1014. The threaded holes 1013 are formed in the projecting portions 1018 of the lower case 103 so that the fixing screws 1015 are fixedly screw-threaded into the respective threaded holes 1013. The projecting portions 1017 of the upper case 102 are fixed to the respective projecting portions 1018 of the lower case 103 using the fixing screws 1015 inserted through the respective screw insertion holes 1014 in the projecting portions 1017 and fixed in the respective threaded holes 1013 in the projecting portions 1018. Each of the grip portions 106 is provided with, for example, two screw fixing portions 105. Specifically, the screw fixing portion 105 is provided at each of opposite ends of each grip portion 1016.

The case fitting portion 104 is partly deformed so that the internal pressure of the case main body 1a is relieved through the deformed portion. That is, the case fitting portion 104 is included in the pressure relief valve 107.

As depicted in FIG. 10, in the present embodiment, the pressure relief portion 107 corresponds to wall surface middle portions 1010b each located between two adjacent corners of four corners 1010a of the case main body 1a. Specifically, each of the wall surface middle portions 1010b is a middle portion of the corresponding side wall portions located between one of the two screw fixing portions 105 for the side wall portion and the other screw fixing portion 105 as described below.

If the case main body 1a is subjected to rapid volume expansion exceeding the capacity of gas discharged to the outside through the first pressure relief valve 11 and the second pressure relief valve 12, the pressure relief portion 107 safely releases the gas in the case main body 1a to prevent the case main body 1a from being exploded.

That is, the pressure relief portion 107 safely releases the internal pressure of the case main body 1a to prevent the case main body 1a from being exploded when the internal pressure of the case main body 1a rises and reaches a predetermined value even while the seal member 17 of the first pressure relief valve 11 and the seal member 17 of the second pressure relief valve 12 are being deformed to discharge the gas inside the case main body 1a through the gaps 19a in the insertion portion 13 of the first pressure relief valve 11 and the gaps 19a in the insertion portion 13 of the second pressure relief valve 12.

In the present embodiment, the wall surface middle portions 1010b of the case main body 1a are easily deformed, and the case fitting portion 104 is easily destroyed as a result of the deformation. Thus, the wall surface middle portions 1010b of the case main body 1a form the pressure relief portion 107 in the present embodiment. When the case main body 1a is subjected to volume expansion, the packing 1012 in the packing installation portion 1011 is destroyed due to tensile deformation of the wall surface middle portions 1010b resulting from the volume expansion of the case main body 1a.

Now, effects of the explosion-proof waterproof case 1 in the present embodiment configured as described above will be described. The packing 1012 of the packing installation portion 1011 is a rubbery liquid packing which is fluid when applied. After being applied in the packing installation portion 1011, the liquid packing is hardened and becomes rubbery. Thus, the packing 1012 adheres to the wall surface of the packing installation portion 1011, thus maintaining airtightness. The packing 1012, due to the rubbery nature thereof, follows deformation of the wall surface to some degree, thus maintaining airtightness. Thus, the explosion-proof waterproof case 1 in the present embodiment is prevented from being burst by a rise in the internal pressure of the case main body 1a in the normal state. That is, bursting of the explosion-proof waterproof case 1 is prevented by elastic deformation.

When the gas inside the explosion-proof waterproof case 1 is subjected to a rapid change in volume (when the case main body 1a is subjected to rapid volume expansion exceeding the capacity (speed) of gas discharged to the outside of the case main body 1 through the first pressure relief valve 11 and the second pressure relief valve 12), a strong pressing force acts in a direction from a central point O of the explosion-proof waterproof case 1 toward the outside of the case main body 1a, for example, as depicted by arrows in FIG. 11.

The pressing force causes tensile deformation in the wall surfaces of the case main body 1a as depicted by virtual lines in FIG. 11. For the tensile deformation of the case main body 1a, a large amount of deformation occurs in the wall surface middle portions 1010b each located between two adjacent corners of the four corners 1010a of the case main body 1a. As the position shifts from each of the wall surface middle portions 1010b toward the corresponding corner 1010a, the rate of tensile deformation decreases, while the rate of bending deformation increases.

Therefore, when tensile deformation depicted by virtual lines in FIG. 11 occurs, the wall surface middle portions 1010b are deformed to subject a wall surface of the wall portion of the fitting protruding portion 104a of the lower case 103 and a wall surface of the wall portion of the fitting recessed portion 104b of the upper case 102 to "deformation in a shearing direction (slip direction)" as depicted in FIG. 12.

At the time of deformation in the slip direction, the packing 1012 in the packing installation portion 1011 is subjected to shear failure as depicted in FIG. 13. An area where the shear failure occurs is normally one of the wall surface middle portions 1010b each located between two adjacent corners of the four corners 1010a of the case main body 1a. The gas inside the case main body 1a rapidly flows out through the area where the packing 1012 is subjected to shear failure, thus relieving the internal pressure of the case main body 1a. Once the internal pressure is relieved though any one of safe relief portions (the areas where the packing 1012 is subjected to shear failure) corresponding to the wall surface middle portions 1010b each located between two adjacent corners of the four corners 1010a, the deformation of the remaining wall surface middle portion 1010b is stopped.

The four corners 1010a of the case main body 1a are subjected to little tensile deformation, precluding the packing 1012 from being simultaneously damaged at a plurality of the corners. In other words, the likelihood is low that the packing 1012 of the packing installation portion 1011 is simultaneously damaged at a plurality of the corners to cause a part of the case main body 1a to be blown off. Furthermore, the screw fixing portions 105 are normally provided at the four corners 1010a of the case main body 1a to prevent the packing 1012 from being damaged. Thus, the likelihood is substantially zero that the case main body 1a bursts at the four corners of the case main body 1a.

FIG. 14 and FIG. 15 depict a comparative example of the safe relief portion of the explosion-proof waterproof case 1 in the first embodiment. In the case used in the comparative example, the packing 1012 is installed in an area where an end surface of the lower case 103 is brought into abutting contact with an end surface of the upper case 102 as depicted in FIG. 14. In this case, when the case main body 1a is subjected to rapid internal volume expansion, the tensile force of tensile deformation acts on the packing 1012 as depicted in FIG. 14. Thus, a tensile force acting in the same direction as that of the tensile force of tensile deformation of the case main body 1a acts on the packing 1012. Consequently, a strong tensile force acts on the packing 1012.

Therefore, in this case, the packing 1012 is rapidly cracked and destroyed, and thus, a large amount of internal gas is emitted through a destroyed portion of the packing 1012, causing the case main body 1a to burst as depicted in FIG. 15.

If the case main body 1a in the present embodiment configured as described above is subjected to rapid internal volume expansion exceeding the capacity (speed) of gas emitted through the first pressure relief valve 11 and the second pressure relief valve 12, a part of the case main body 1a is safely released through one of the wall surface middle portions 1010b each located between two adjacent corners 1010a of the four corners, in other words, through the pressure relief portion 107. This allows the case main body 1a to be prevented from being exploded.

The pressure relief portion 107 also operates to allow the case main body 1a to be prevented from bursting if the first pressure relief valve 11 and the second pressure relief valve 12 fail, that is, the gas inside the case main body 1a is precluded from being discharged to the outside, or if only one of the first and second pressure relief valves fails.

Therefore, a pressure relief mechanism can be provided which allows the case main body 1a to be prevented from bursting when rapid expansion of the internal volume of a waterproof case with low pressure resistance results from entry of the waterproof case into a state of emergency.

Figure 16:
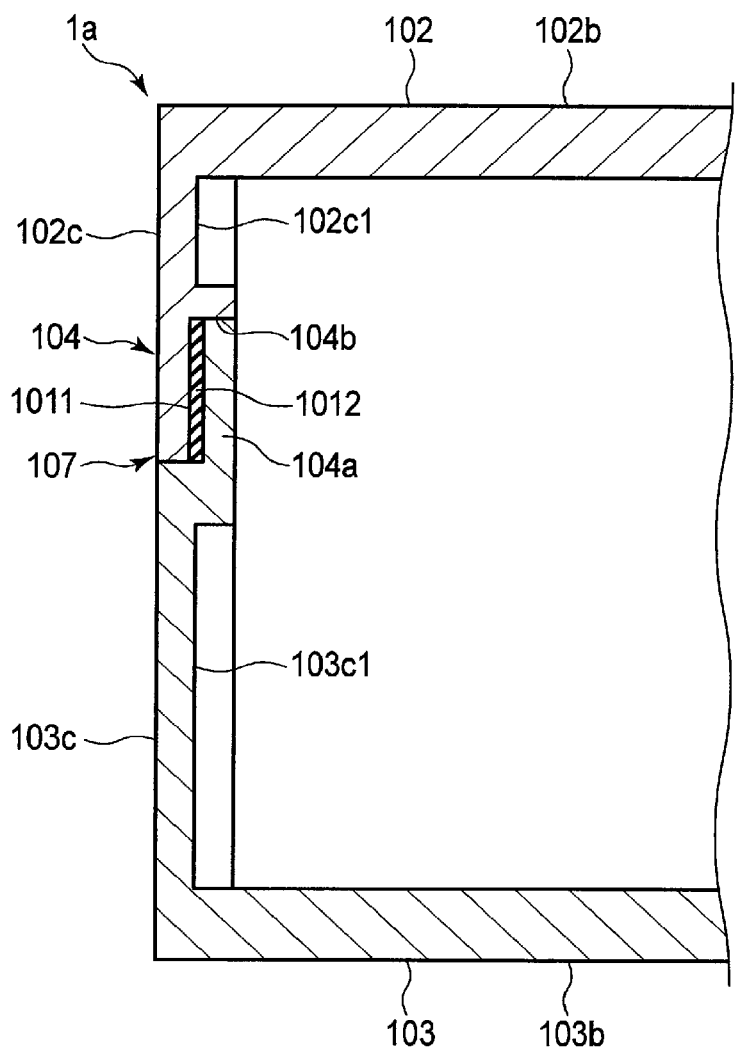
FIG. 16 is a longitudinal sectional view of a main part of the explosion-proof waterproof case in the first embodiment, depicting a first modification of a case main body of the explosion-proof waterproof case.

FIG. 16 is a longitudinal sectional view of a main part of the explosion-proof waterproof case 1 in the first embodiment, depicting a first modification. In the present modification, near one of the wall surface middle portions 1010b each located between two adjacent corners of the four corners 1010a, in this case, near the wall surface middle portion 1010b of the case fitting portion 104 of the side wall portion 102c included in the four side wall portions 102c, 102d, 102e, 102f of the upper case 102, a thin walled portion 102c1 is provided which is thinner than the remaining part of the side wall portions 102c. The thin walled portion 102c1 is not provided in the other three side wall portions 102d, 102e, 102f of the upper case 102.

Similarly, near the wall surface middle portion 1010b of the case fitting portion 104 of the side wall portion 103c included in the four side wall portions 103c, 103d, 103e, 103f of the lower case 103, a thin walled portion 103c1 is provided which is thinner than the remaining part of the side wall portions 103c. The thin walled portion 103c1 is not provided in the other three side wall portions 103d, 103e, 103f of the lower case 103.

Therefore, in the present modification, when the case main body 1a is subjected to rapid internal volume expansion, the amount of tensile deformation can be made larger in the thin walled portion 102c1 of the upper case 102 and in the thin walled portion 103c1 of the lower case 103 than in the remaining parts of the upper case 102 and the lower case 103. Thus, the packing 1012 can be subjected to shear failure in portions (pressure relief position setting portions) corresponding to the thin walled portion 102c1 of the upper case 102 and the thin walled portion 103c1 of the lower case 103. The pressure can be initially relieved through these areas. This enables determination of the positions where the pressure is initially relieved when the case main body 1a is subjected to rapid internal volume expansion, allowing determination of the direction of the gas (which is in many cases hot and toxic) emitted from the inside of the case main body 1a and flying around.

Figure 17:
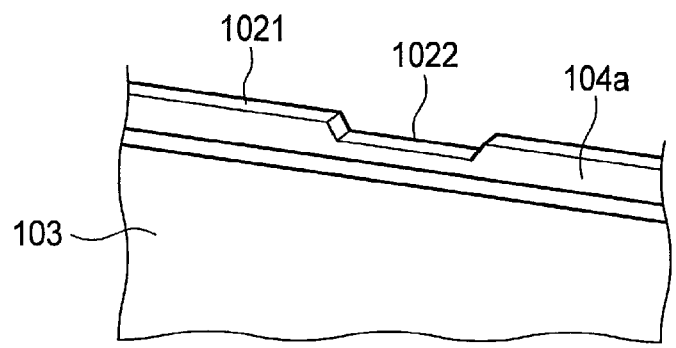
FIG. 17 is a perspective view of a main part of a second modification of the case main body of the explosion-proof waterproof case in the first embodiment.
Figure 18:
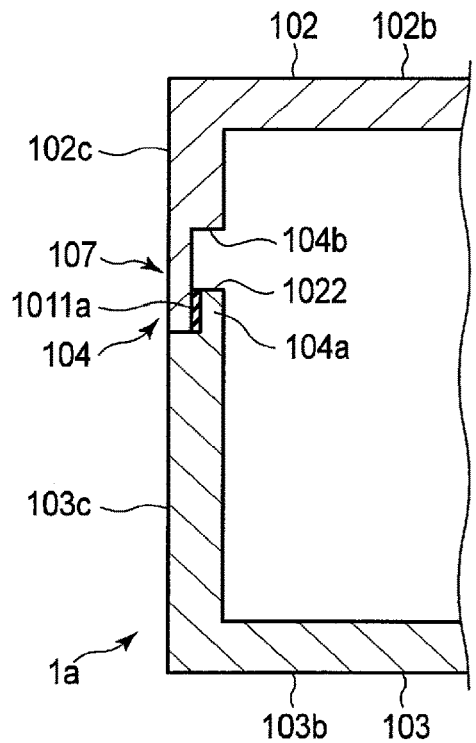
FIG. 18 is a longitudinal sectional view of a main part of the second modification of the case main body of the explosion-proof waterproof case in the first embodiment, illustrating a portion of the case main body in which a packing receiver is small in size.
Figure 19:
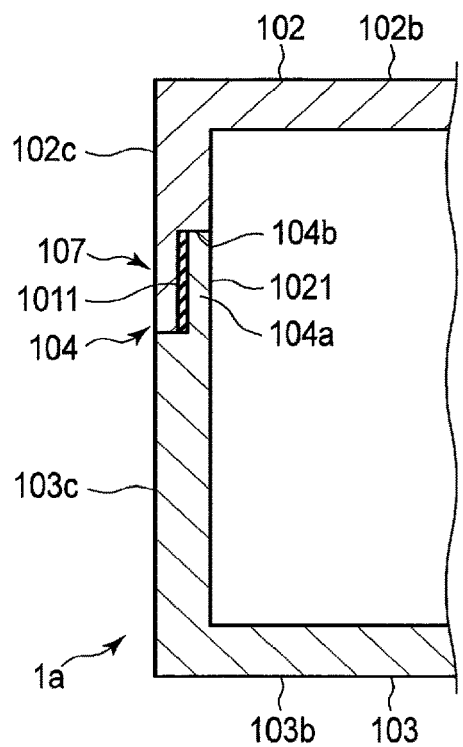
FIG. 19 is a longitudinal sectional view of the main part of the second modification of the case main body of the explosion-proof waterproof case in the first embodiment, illustrating a portion of the case main body in which the packing receiver is large in size.

FIG. 17, FIG. 18, and FIG. 19 depict a main part of a second modification of the explosion-proof waterproof case 1 in the first embodiment. In the present modification, a cutout portion 1022 is formed in a part of a ridge 1021 of the wall portion of the fitting protruding portion 104a of the lower case 103 which forms a part of the wall surface of the packing installation portion 1011 as depicted in FIG. 17. That is, the cutout portion 1022 serves to reduce the amount of fitting.

In the present embodiment, as depicted in FIG. 18, the cutout portion 1022 is formed in the fitting protruding portion 104a of the case fitting portion 104 formed in one of the four wall surface middle portions 1010b. Consequently, as depicted in FIG. 18, the cutout portion 1022 corresponds to a small area portion 1011a of the packing installation portion 1011 which has a smaller area than the remaining part of the packing installation portion 1011 (the part of the packing installation portion 1011 which does not include the cutout portion 1022 as depicted in FIG. 19).

Therefore, in the present modification, when the case main body 1a is subjected to rapid internal volume expansion, the amount of tensile deformation can be made larger in the small area portion 1011a of the packing installation portion 1011 than in the remaining part of the packing installation portion 1011. Thus, the packing 1012 can be subjected to shear failure in the small area portion 1011a of the packing installation portion 1011. As a result, the pressure can be initially relieved through the small area portion 1011a.

This enables determination of the positions where the pressure is initially relieved when the case main body 1a is subjected to rapid internal volume expansion, allowing determination of the direction of the gas (which is in many cases hot and toxic) emitted from the inside of the case main body 1a and flying into the environment.

If a desired wall surface middle portion 1010b of the four wall surface middle portions 1010b is to be destroyed to relieve the internal pressure of the case main body 1a through this wall surface middle portion 1010b, then for the pressure relief position setting portion of the safe relief portion, a distance between the two screw fixing portions 105 adjacent to the desired wall surface middle portion 1010b may be set larger than a distance between the two screw fixing portions 105 adjacent to each of the other wall surface middle portions 1010b. The pressure relief position setting portion as used herein is a structure provided to set the position where the pressure is relieved, and corresponds to the above-described small area portion 1011a by way of example.

In the portions of the case main body 1a in which the distance between the screw fixing portions 105 is set larger than in the other areas, the amount of tensile deformation of the case main body 1a can be made larger than in the other portions of the case main body 1a. Thus, also in this case, the portions of the case main body 1a in which the distance between the screw fixing portions 105 is set larger than in the other areas can be set as relief areas where the pressure in the case main body 1a is initially relieved.

The portions of the case main body 1a in which the distance between the screw fixing portions 105 is set larger than in the other areas are, for example, the side wall portion 103c and the side wall portion 102c of the case main body 1a, and the side wall portion 103d and the side wall portion 102d of the case main body 1a as depicted in FIG. 1. This is because, for the side wall portion 103f and the side wall portion 102f, the screw fixing portion 105 is formed at each of the opposite ends of the grip portion 1016 and each of the opposite ends of the side wall portion, and thus, a total of four screw fixing portions 105 are formed, so that the distance between the two screw fixing portions 105 located across the wall surface middle portion 1010b is smaller than the distance between the two screw fixing portions 105 located across the wall surface middle portion 1010b for the side wall portion 103c and the side wall portion 102c and the distance between the two screw fixing portions 105 located across the wall surface middle portion 1010b for the side wall portion 103d and the side wall portion 102d. This also applies to the side wall portions 103e and the side wall portions 102e.

Figure 20:
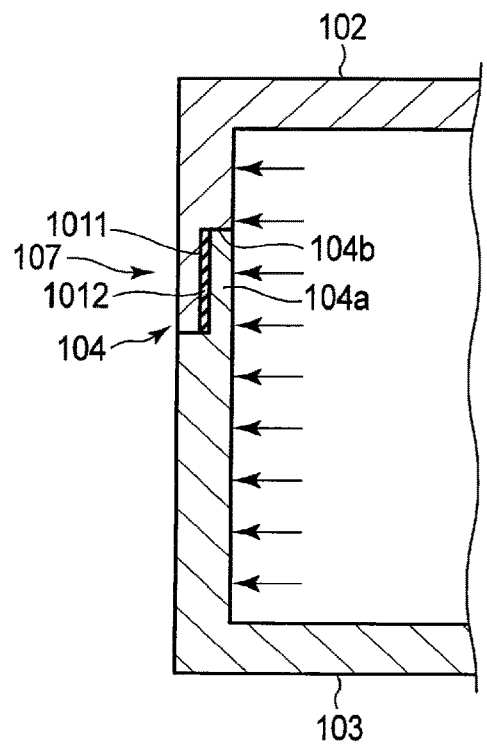
FIG. 20 is a longitudinal sectional view of a main part of a third modification of the case main body of the explosion-proof waterproof case in the first embodiment, illustrating a first combination in which a release pressure for the case main body is increased.
Figure 21:
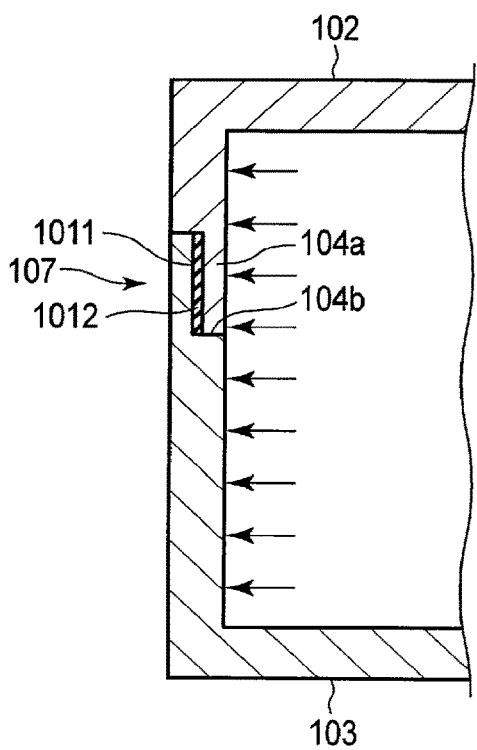
FIG. 21 is a longitudinal sectional view of a main part of the third modification, illustrating a second combination in which the release pressure for the case main body is reduced.

FIG. 20 and FIG. 21 depict a third modification of the explosion-proof waterproof case 1 in the first embodiment. In the present modification, the shape of the case fitting portion 104 is adjusted to regulate the pressure at which the case fitting portion 104 is destroyed.

FIG. 20 is a longitudinal sectional view of a main part of the third modification, illustrating a first combination of the fitting protruding portion 104a and the fitting recessed portion 104b of the case fitting portion 104 in which the release pressure for the case main body 1a is increased. FIG. 21 is a longitudinal sectional view of a main part of the third modification, illustrating a second combination of the fitting protruding portion 104a and the fitting recessed portion 104b of the case fitting portion 104 in which the release pressure for the case main body 1a is reduced.

In the first combination illustrated in FIG. 20, the fitting protruding portion 104a is formed on the upper case 102 comprising a case wall surface with a small area, and the fitting recessed portion 104b is formed in the lower case 103 comprising a case wall surface with a large area.

In this case, the upper case 102 comprising the case wall surface with the small area is positioned outside the fitting protruding portion 104a of the lower case 103, the case main body 1a is pushed from inside by a high load imposed by the fitting protruding portion 104a of the lower case 103 located inside and having the large area. This load acts in a direction in which the packing installation portion 1011 is compressed. Thus, the packing 1012 in the packing installation portion 1011 is subjected to shearing deformation under a compressive load, leading to a relatively high pressure acting to open the case fitting portion 104.

On the other hand, in the second combination illustrated in FIG. 21, the fitting protruding portion 104a is formed on the upper case 102 comprising a case wall surface with a small area, and the fitting recessed portion 104b is formed in the lower case 103 comprising a case wall surface with a large area. In this case, the upper case 102 comprising the case wall surface with the small area is positioned inside the lower case 103. Thus, when the case main body 1a is pushed from inside by a high load imposed on the externally fitted portion having the large area (the wall portion of the fitting recessed portion 104b of the lower case 103), nothing holds the case main body 1a pushed from inside.

In this case, a load acts on the packing 1012 in the packing installation portion 1011 in a tensile direction, and thus, the packing 1012 is subjected to a tensile load in a direction in which the fitting recessed portion 104b is separated from the fitting protruding portion 104a. The packing 1012 is thus subjected to shearing deformation while being nearly torn away. This reduces the release pressure for the case main body 1a.

Therefore, in the present modification, the release pressure for the case main body 1a can be adjusted by selecting either the first combination illustrated in FIG. 20 or the second combination illustrated in FIG. 21 as the combination of the fitting protruding portion 104a and the fitting recessed portion 104b of the case fitting portion 104.

In the first embodiment, the present invention is applied to a battery case for secondary batteries by way of example. However, the present invention is not limited to this. For example, the present invention can be applied to a battery case for fuel cells or a fuel tank.

The embodiments can provide a pressure relief valve which allows a waterproof case with low pressure resistance to be prevented from bursting when the case is subjected to rapid internal volume expansion in case of emergency. The embodiments can provide an explosion-proof waterproof case which allows a waterproof case with low pressure resistance to be prevented from bursting when the case is subjected to rapid internal volume expansion in case of emergency.

Figure 22:
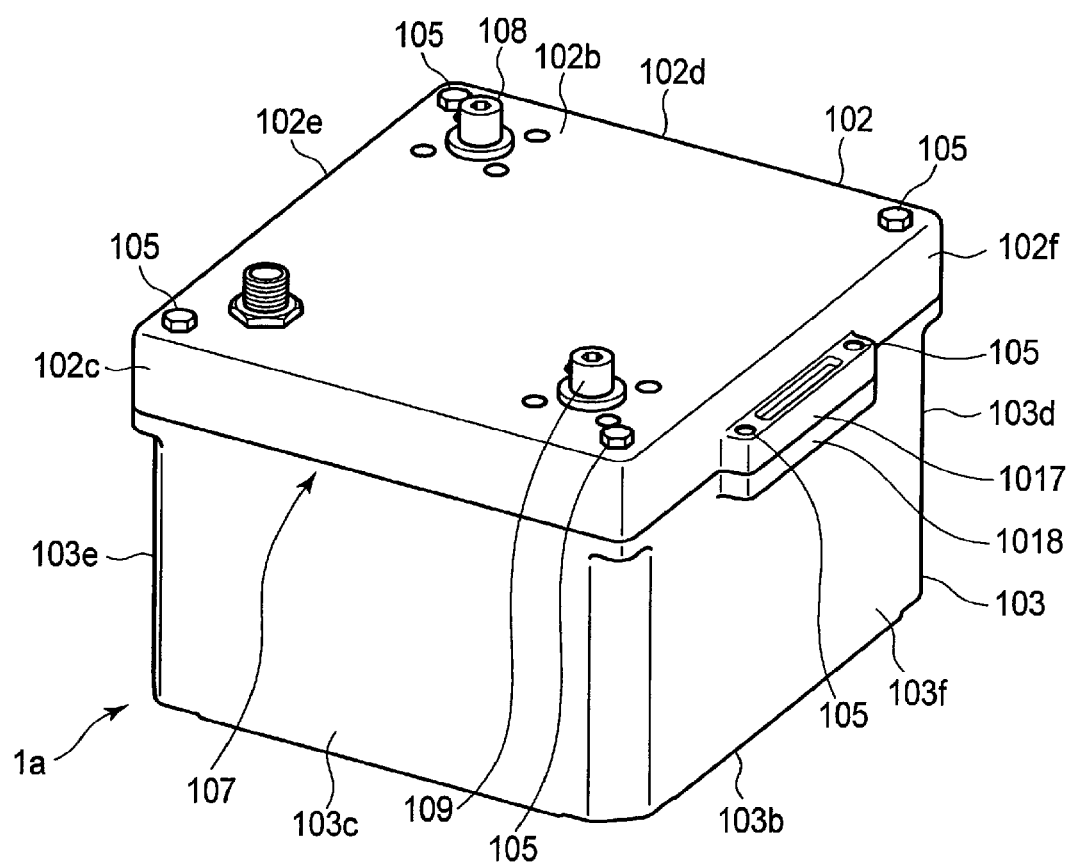
FIG. 22 is a perspective view depicting an explosion-proof waterproof case according to a second embodiment.

In the first embodiment, the explosion-proof waterproof case 1 comprises the first pressure relief valve 11, the second pressure relief valve 12, and the case fitting portion 104. In another example, in the explosion-proof waterproof case 1, the first pressure relief valve 11 and the second pressure relief valve 12 may be omitted from the case main body 1a, and the case fitting portion 104 may be formed to release the internal pressure to the outside as depicted in FIG. 22.

In the first embodiment, the bottom surfaces 26a of the cutout portions 26 of the barrier 25 are flush with (are located at the same height as that of) the area between the protruding portion 21 and the barrier 25. However, the present invention is not limited to this. In another example, as shown in FIG. 23, in the outer surface of the top plate 2 of the case main body 1a, the area of the outer surface between the protruding portion 21 and the barrier 25 may be higher than the bottom surfaces 26a of the cutout portions 26 of the barrier 25. In this case, this difference in height allows water in the barrier 25 to be smoothly discharged to the outside of the barrier 25 through the cutout portion 26.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pressure relief mechanism comprising:
a case in which an installation hole is formed;
a pressure relief valve comprising an insertion portion inserted into the installation hole and comprising a vent path formed in an axial portion of the insertion portion and a slit formed in a peripheral wall portion of the insertion portion so as to communicate with the vent path, a pedestal portion provided at an outer end of the insertion portion arranged outside the case, a locking portion provided at an inner end of the insertion portion inserted into the case and locked on an inner edge of the installation hole, and a ring-like seal member interposed between a wall portion of the case around the installation hole and the pedestal portion so as to surround a periphery of the installation hole, the seal portion comprising an elastic member,
wherein:
the case comprises a ring-like protruding portion;
the ring-like protruding portion is provided on an outer surface of the case and is arranged at an outer end of the installation hole so as to protrude outward;
an outer peripheral surface of the ring-like protruding portion comprises a tapered surface such that an outer diameter of the ring-like protruding portion gradually decreases toward a tip portion of the ring-like protruding portion; and
the seal member is installed on the tapered surface of the ring-like protruding portion.

2. The pressure relief mechanism according to claim 1, wherein the pedestal portion comprises a vent path for the pedestal portion which communicates with the vent path in the insertion portion, and
the pedestal portion comprises a pressure relief portion comprising a waterproof vent filter installed so as to occlude the vent path for the pedestal portion and exchanging gas inside the vent path for the pedestal portion with gas outside the vent path for the pedestal portion while keeping inside of the vent path for the pedestal portion water tight, the pressure relief portion allowing the gas to pass through the waterproof vent filter at a pressure lower than a pressure at which the seal member is elastically deformed.

3. The pressure relief mechanism according to claim 2, wherein the pressure relief valve comprises a disc-like cover member arranged outside the pedestal portion,
the pedestal portion comprises a plurality of projecting portions configured to support the cover member,
the pressure relief portion is arranged inside the projecting portions, and
the case comprises a tubular barrier provided on an outer surface of the case so as to surround an outer peripheral portion of the pressure relief valve.

4. The pressure relief mechanism according to claim 3, wherein the cover member comprises a plurality of projecting portions on an outer peripheral surface of the cover member.

5. The pressure relief mechanism according to claim 3, wherein the barrier comprises a cutout portion,
the case comprises a ring-like protruding portion provided at an outer end of the installation hole so as to protrude outward and comprising a tapered surface such that an outer diameter of the protruding portion gradually decreases toward a tip portion of the protruding portion,
the seal member is installed on the tapered surface of the protruding portion, and
a portion of an outer surface of the case which is located between the protruding portion and the barrier is at the same height as that of a bottom surface of the cutout portion or is higher than the bottom surface.

6. The pressure relief mechanism according to claim 1, wherein the insertion portion comprises a plurality of elastically deformable leg portions,
the locking portion comprises pawl portions each formed at a tip of the corresponding leg portion,
each of the pawl portions comprises a locking protruding portion which protrudes outward,
the insertion portion is inserted into the installation hole so as to elastically deform the leg portions in a direction in which a diameter of a set of the leg portions decreases, and
a change in shape occurs such that the leg portions are elastically recovered with tips of the pawl portions protruding into the case through the installation hole, allowing the locking protruding portion to be locked on an inner edge of the installation hole.

7. The pressure relief mechanism according to claim 1, wherein, on a surface of the pedestal portion which is closer to the insertion portion, a ring-like protruding portion for the pedestal portion is formed which protrudes in a direction in which the insertion portion extends with respect to the pedestal portion, the protruding portion comprising a tapered surface such that an outer diameter of the protruding portion gradually decreases toward a tip of the protruding portion.

8. The pressure relief mechanism according to claim 1, wherein the case comprises:
a lower case shaped like a rectangular box and in which an upper surface opening is formed;
an upper case shaped like a rectangular box and in which a lower surface opening is formed;
a case fitting portion comprising a fitting recessed portion formed in one of a peripheral wall portion of the upper surface opening of the lower case and a peripheral wall portion of the lower surface opening of the upper case and a fitting protruding portion formed on the other of the peripheral wall portions such that the fitting protruding portion and the fitting recessed portion are joined together to close a space between the lower case and the upper case and such that the fitting recessed portion and the fitting protruding portion formed at a wall surface middle portion located between corners of the case are released at a pressure higher than a pressure which acts on the seal member to deform the seal member; and
a screw fixing portion provided in the case to threadably fix the upper case and the lower case together.

9. The pressure relief mechanism according to claim 8, wherein a packing is provided between the fitting protruding portion and the fitting recessed portion of the case fitting portion.

10. The pressure relief mechanism according to claim 9, wherein the packing is a liquid packing.

11. The pressure relief mechanism according to claim 9, wherein an amount of fitting between the fitting protruding portion and the fitting recessed portion of the case fitting portion is smaller at a desired part of the wall surface middle portion than at the other part of the wall surface middle portion.

12. The pressure relief mechanism according to claim 8, wherein a wall thickness of the case is at least partly smaller in a vicinity of the case fitting portion located at the wall surface middle portion than in the other portions of the case.

13. The pressure relief mechanism according to claim 8, wherein a plurality of the screw fixing portions is provided, and
- a distance between two of the screw fixing portions arranged on opposite sides of a desired wall surface middle portion of the four wall surface middle portions of the case is larger than distances between the other screw fixing portions.

14. The pressure relief mechanism according to claim 8, wherein the case fitting portion has a first combination in which the fitting protruding portion is formed on one of a wall surface of the lower case and a wall surface of the upper case which is larger in area, with the fitting recessed portion formed in the other wall surface, or a second combination in which the fitting protruding portion is formed on one of the wall surface of the lower case and the wall surface of the upper case which is smaller in area, with the fitting recessed portion formed in the other wall surface.

15. A pressure relief valve comprising:
- an insertion portion enabled to be inserted into an installation hole in an internally closed case and comprising a vent path formed in an axial portion of the insertion portion and a slit formed in a peripheral wall portion of the insertion portion so as to communicate with the vent path; and
- a pedestal portion formed at a first end of the insertion portion;
- a locking portion formed at a second end of the insertion portion and enabled to be locked on an inner edge of the installation hole; and
- a seal member interposed between the case and the pedestal portion so as to surround a periphery of the installation hole, the seal member comprising an elastic member,
- wherein, on a surface of the pedestal portion which is closer to the insertion portion, a ring-like protruding portion is formed so as to surround the vent path, the ring-like protruding portion protrudes in a direction in which the insertion portion extends with respect to the pedestal portion, and an outer peripheral surface of the ring-like protruding portion comprises a tapered surface such that an outer diameter of the protruding portion gradually decreases toward a tip of the protruding portion.

16. The pressure relief valve according to claim 15, wherein the pedestal portion comprises a vent path for the pedestal portion which communicates with the vent path in the insertion portion, and
- the pedestal portion comprises a pressure relief portion comprising a waterproof vent filter installed so as to occlude the vent path for the pedestal portion and exchanging gas inside the vent path for the pedestal portion with gas outside the vent path for the pedestal portion while keeping inside of the vent path for the pedestal portion waterproof, the pressure relief portion allowing the gas to pass through at a pressure lower than a pressure which acts through the slit and at which the seal member is elastically deformed.

17. The pressure relief valve according to claim 16, further comprising a disc-like cover member arranged outside the pedestal portion,
- wherein the pedestal portion comprises a plurality of projecting portions configured to support the cover member, and
- the pressure relief portion is arranged inside the projecting portions.

* * * * *